(12) United States Patent
Kato

(10) Patent No.: US 10,083,756 B2
(45) Date of Patent: Sep. 25, 2018

(54) SEMICONDUCTOR MEMORY DEVICE

(71) Applicant: Toshiba Memory Corporation, Minato-ku, Tokyo (JP)

(72) Inventor: Koji Kato, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/454,992

(22) Filed: Mar. 9, 2017

(65) Prior Publication Data

US 2017/0345504 A1 Nov. 30, 2017

(30) Foreign Application Priority Data

May 24, 2016 (JP) .................................. 2016-103372

(51) Int. Cl.

| G11C 16/06 | (2006.01) |
|---|---|
| G11C 16/10 | (2006.01) |
| G11C 16/04 | (2006.01) |
| G11C 16/08 | (2006.01) |
| G11C 16/16 | (2006.01) |
| G11C 16/26 | (2006.01) |
| G11C 5/06 | (2006.01) |
| G11C 8/12 | (2006.01) |
| G11C 7/10 | (2006.01) |

(52) U.S. Cl.
CPC .............. *G11C 16/10* (2013.01); *G11C 5/063* (2013.01); *G11C 8/12* (2013.01); *G11C 16/0483* (2013.01); *G11C 16/08* (2013.01); *G11C 16/16* (2013.01); *G11C 16/26* (2013.01); *G11C 7/1063* (2013.01)

(58) Field of Classification Search
CPC . G11C 16/26; G11C 16/0483; G11C 11/4074; G11C 11/4076; G11C 11/41; G11C 11/5621; G11C 11/5628; G11C 11/5635; G11C 11/5642; G11C 11/5671; G11C 16/0416; G11C 16/10; G11C 16/16; G11C 2029/5006
USPC ............ 365/185.17, 185.05, 185.13, 189.09, 365/185.29, 200, 226, 230.03, 185.11, 365/185.23, 185.24, 189.02
See application file for complete search history.

(56) References Cited

U.S. PATENT DOCUMENTS 9,053,765 B2 6/2015 Fukano
9,472,292 B1* 10/2016 Lee ........................ G11C 16/12

* cited by examiner

*Primary Examiner* — Thong Q Le
(74) *Attorney, Agent, or Firm* — White & Case LLP

(57) ABSTRACT

According to one embodiment, a semiconductor memory device includes a row decoder that outputs a first signal to a first wiring and outputs a second signal to a second wiring, a switch that has one end to which a first voltage is supplied, another end connected to the first wiring, and a gate connected to the second wiring, a first transistor and a second transistor that have respective gates connected to the first wiring at connecting positions located between the row decoder and the another end of the switch on the first wiring, a third transistor and a fourth transistor that have respective gates to which signals having opposite logic levels are respectively input, and a driver that is connected to one end of the first transistor via the third transistor and is connected to one end of the second transistor via the fourth transistor.

15 Claims, 16 Drawing Sheets

SEMICONDUCTOR MEMORY DEVICE

CROSS-REFERENCE TO RELATED APPLICATION

This application is based upon and claims the benefit of priority from Japanese Patent Application No. 2016-103372; filed May 24, 2016, the entire contents of which are incorporated herein by reference.

FIELD

Embodiments described herein relate generally to a semiconductor memory device.

BACKGROUND

There is known a NAND-type flash memory as a semiconductor memory device.

An Example of related art includes U.S. Pat. No. 9,053,765.

DETAILED DESCRIPTION

Figure 1:
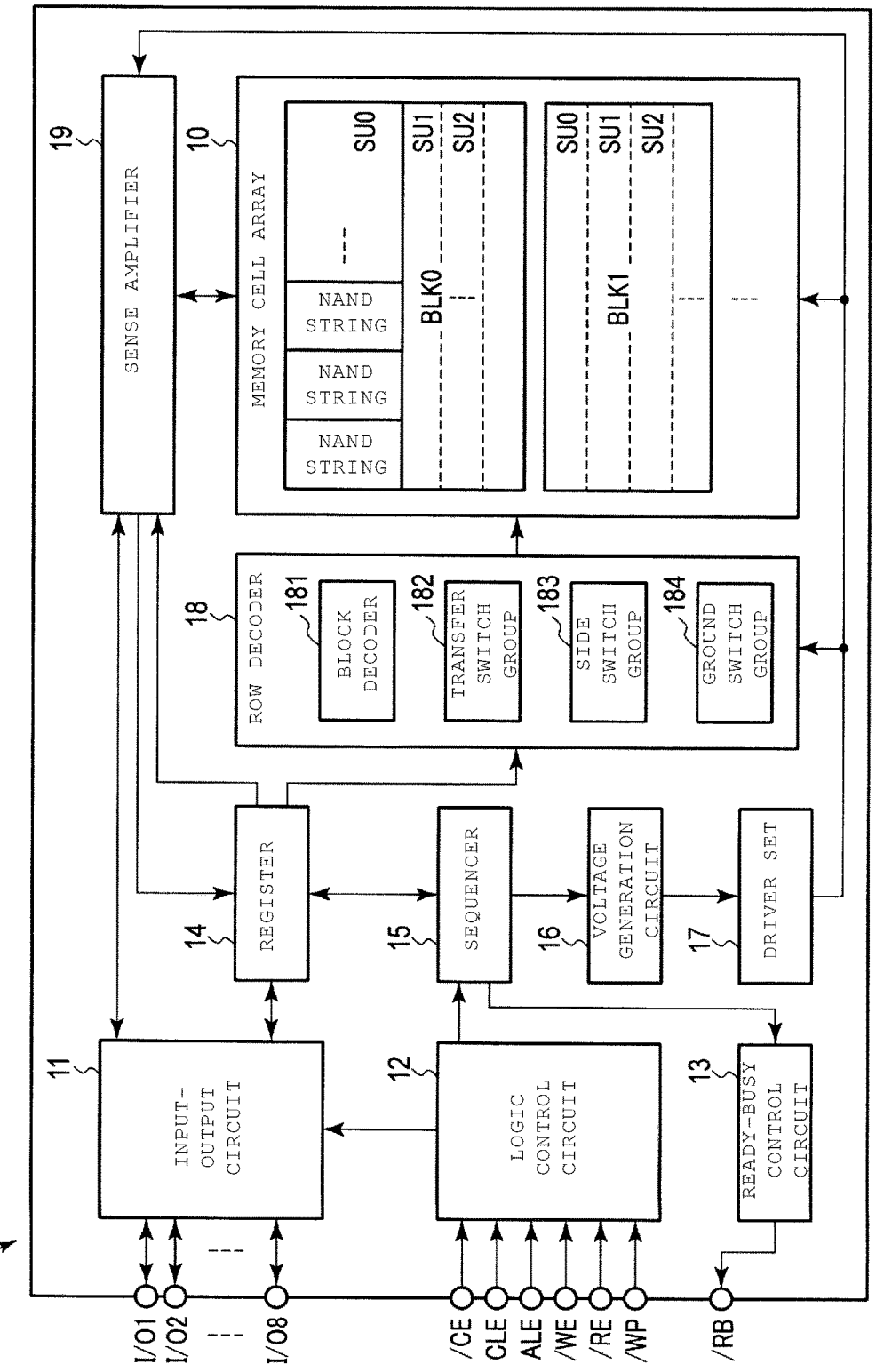
FIG. 1 is a block diagram illustrating a configuration of a semiconductor memory device according to a first embodiment.

According to an exemplary embodiment, a non-selection block is prevented from being selected in parallel with a selection block.

In general, according to one embodiment, a semiconductor memory device includes a row decoder, a switch, a first transistor, a second transistor, a third transistor, a fourth transistor, and a driver. The row decoder outputs a first signal to a first wiring and outputs a second signal to a second wiring. The switch has one end to which a first voltage is supplied, another end connected to the first wiring, and a gate connected to the second wiring. The first transistor and the second transistor have respective gates connected to the first wiring at connecting positions located between the row decoder and the another end of the switch on the first wiring. The third transistor and the fourth transistor have respective gates to which signals having opposite logic levels are respectively input. The driver is connected to one end of the first transistor via the third transistor and is connected to one end of the second transistor via the fourth transistor.

Hereinafter, exemplary embodiments will be described with reference to the drawings. Furthermore, in the following description, components having the same functions and configurations are assigned the respective same reference characters. Moreover, in the case of differentiating between a plurality of components having the same reference character, respective suffixes are added to the same reference character for differentiation. In the case of no need to differentiate between a plurality of components, only the same reference character is assigned to the plurality of components without addition of suffixes. Furthermore, in the present disclosure and claims, the term "connection" between two elements includes another conductive element intervening between the two elements. Additionally, the term "disconnection" between two elements includes the two elements being electrically insulated from each other.

1. First Embodiment

A semiconductor memory device according to a first embodiment is described. An example of the semiconductor memory device according to the first embodiment is illustrated as a NAND-type flash memory in which memory cells are three-dimensionally stacked in layers.

1.1 Configuration 1.1.1 Configuration of Semiconductor Memory Device

A configuration example of the semiconductor memory device according to the first embodiment is described with reference to FIG. 1. FIG. 1 is a block diagram illustrating an example of a configuration of the semiconductor memory device according to the first embodiment.

The semiconductor memory device 1 includes a memory cell array 10, an input-output circuit 11, a logic control circuit 12, a ready-busy control circuit 13, a register 14, a sequencer 15, a voltage generation circuit 16, a driver set 17, a row decoder 18, and a sense amplifier 19.

The memory cell array 10 includes a plurality of blocks BLK (BLK0, BLK1, . . . ). The block BLK includes a plurality of non-volatile memory cell transistors (not illustrated) associated with word lines and bit lines. For example, the block BLK serves as a unit of data erasure, so that data stored in the same block BLK is collectively erasable at once. Each block BLK includes a plurality of string units SU (SU0, SU1, SU2, ... ). Each string unit SU is a set of NAND strings NS. Each NAND string NS includes a plurality of memory cell transistors. Furthermore, the number of blocks included in the memory cell array 10, the number of string units included in one block BLK, and the number of NAND strings included in one string unit SU can be set as respective optional numbers.

The input-output circuit 11 transmits and receives signals I/O (I/O1 to I/O8) to and from an apparatus located outside the semiconductor memory device 1. Each signal I/O is an entity of data, and includes, for example, a command, an address, and write data or read data. The command is an instruction for various operations. The address includes a row address and a column address. The input-output circuit 11 transfers a command and an address to the register 14. The input-output circuit 11 transmits and receives write data and read data to and from the sense amplifier 19.

The logic control circuit 12 receives signals /CE, CLE, ALE, /WE, /RE, and /WP from an apparatus located outside the semiconductor memory device 1. The signal /CE is a signal used to enable the semiconductor memory device 1. The signals CLE and ALE are used to notify the semiconductor memory device 1 that the signals I/O which flow to the semiconductor memory device 1 in concurrence with the signals CLE and ALE are a command and an address, respectively. The signal /WE is used to give an instruction to load the signal I/O which flows to the semiconductor memory device 1 in concurrence with the signal /WE into the semiconductor memory device 1. The signal /RE is used to instruct the semiconductor memory device 1 to output a signal I/O. The signal /WP is used to instruct the semiconductor memory device 1 to inhibit data writing and erasure.

The ready-busy control circuit 13 transfers a signal /RB to an apparatus located outside the semiconductor memory device 1 to notify the apparatus of the state of the semiconductor memory device 1. The signal /RB indicates whether the semiconductor memory device 1 is in a ready state (a state of receiving an instruction from an external apparatus) or in a busy state (a state of not receiving an instruction from an external apparatus).

The register 14 retains a command and an address. The register 14 transfers the address to the driver set 17, the row decoder 18, and the sense amplifier 19, and also transfers the command to the sequencer 15. The sequencer 15 receives the command, and then controls the entirety of the semiconductor memory device 1 in accordance with a sequence that is based on the command.

The voltage generation circuit 16 generates various voltages required for operations such as data writing, reading, and erasure based on an instruction from the sequencer 15. The voltage generation circuit 16 supplies the generated voltages to the driver set 17 and the row decoder 18.

The driver set 17 supplies various voltages received from the voltage generation circuit 16 to the row decoder 18 and the sense amplifier 19 based on an address received from the register 14. For example, the driver set 17 supplies various voltages to the row decoder 18 based on a row address included in the address.

The row decoder 18 receives the row address included in the address from the register 14, and selects a block BLK based on the row address. Then, a voltage from the driver set 17 is transferred to the selected block BLK. The row decoder 18 includes a block decoder 181, a transfer switch group 182, a side switch group 183, and a ground switch group 184. Details of a configuration of the row decoder 18 are described below.

During readout of data, the sense amplifier 19 senses read data read out from a memory cell transistor to a bit line, and transfers the sensed read data to the input-output circuit 11. During writing of data, the sense amplifier 19 transfers write data to be written via the bit line to the memory cell transistor. Moreover, the sense amplifier 19 receives a column address included in the address from the register 14, and outputs data stored in a column that is based on the column address.

1.1.2 Configuration of Memory Cell Array

Figure 2:
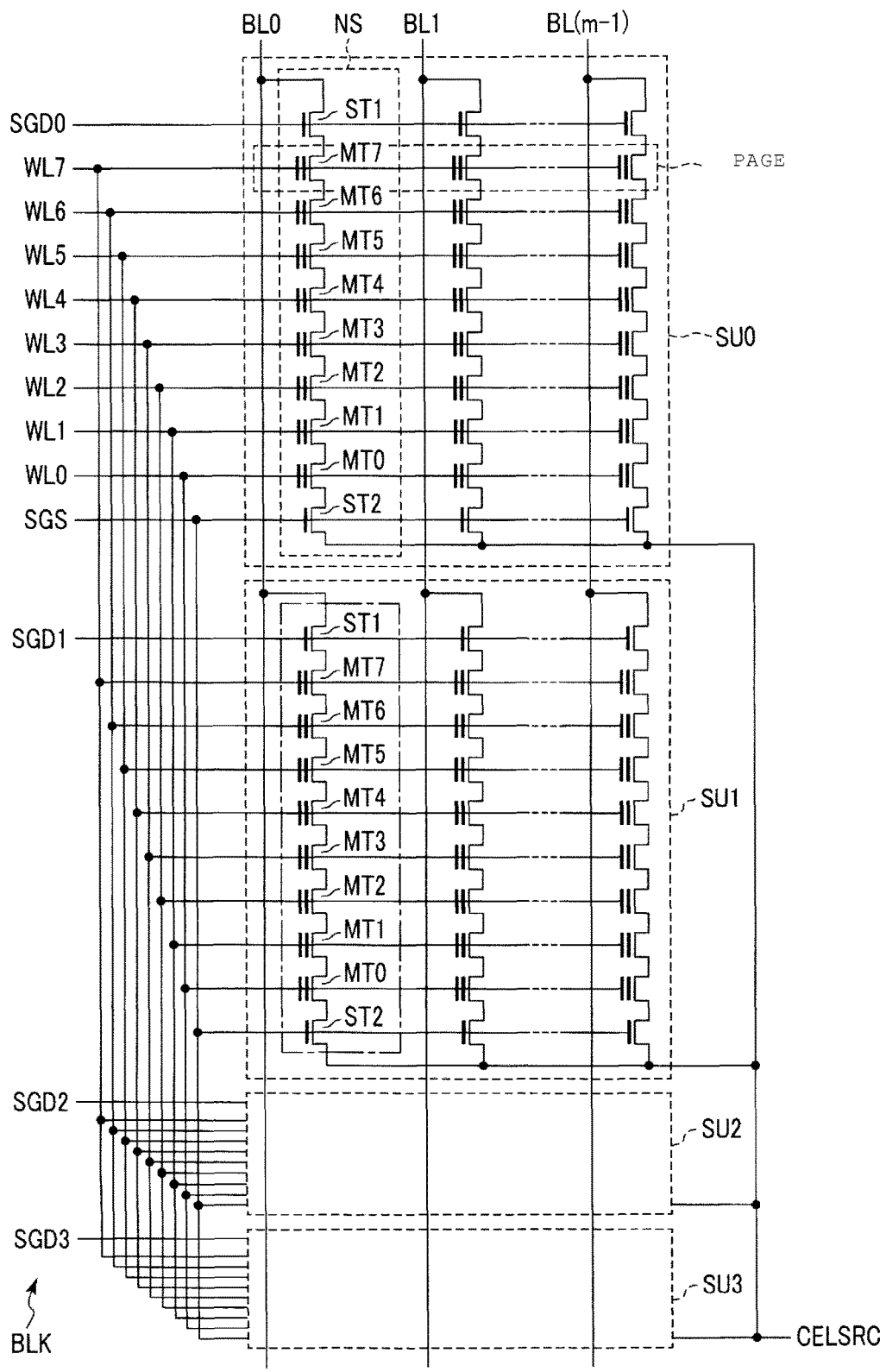
FIG. 2 is a circuit diagram illustrating a configuration of a memory cell array of the semiconductor memory device according to the first embodiment.

Next, a configuration of the memory cell array in the semiconductor memory device according to the first embodiment is described. FIG. 2 is an example of a circuit diagram illustrating a configuration of the memory cell array 10 of the semiconductor memory device 1 according to the first embodiment. FIG. 2 illustrates one block BLK extracted from the blocks BLK included in the memory cell array 10. Furthermore, the other blocks BLK have a similar configuration to the extracted block BLK.

As illustrated in FIG. 2, the block BLK includes, for example, four string units SU (SU0 to SU3). Each string unit SU includes a plurality of NAND strings NS. Each NAND string NS includes, for example, eight memory cell transistors MT (MT0 to MT7) and selection transistors ST1 and ST2.

The memory cell transistor MT includes a control gate and a stacked gate, which includes a charge storage layer. The memory cell transistors MT0 to MT7 are connected in series. The selection transistors ST1 and ST2 are used to select a NAND string NS on which to perform data writing or reading. One end of the selection transistor ST1 is connected to one end of the memory cell transistor MT7. One end of the selection transistor ST2 is connected to one end of the memory cell transistor MT0.

The memory cell array 10 is provided with bit lines BL, word lines WL, select gate lines SGD and SGS, and a source line CELSRC.

For example, there are provided m bit lines BL (bit lines BL0 to BL(m−1)) (m being a natural number). The bit lines BL0 to BL(m−1) are connected to the respective other ends of the selection transistors ST1 included in the NAND strings NS corresponding to the respective same columns in common in each string unit SU.

For example, there are provided eight word lines WL (word lines WL0 to WL7). The word lines WL0 to WL7 are connected to the respective control gates of the memory cell transistors MT0 to MT7 included in each string unit SU in common.

For example, there are provided four select gate lines SGD (select gate lines SGD0 to SGD3). The select gate lines SGD0 to SGD3 are connected to the respective gates of the selection transistors ST1 included in the respective string units SU0 to SU3.

For example, there is provided one select gate line SGS. The select gate line SGS is connected to the respective gates of the selection transistors ST2 included in each string unit SU in common.

The source line CELSRC is provided, for example, between a plurality of blocks BLK in common. The source line CELSRC is connected to the respective other ends of the selection transistors ST2 included in each string unit SU in common.

Furthermore, data reading and writing are collectively performed at once with respect to the memory cell transistors MT connected to the same word line WL. This unit of data reading or writing is handled as a page.

Figure 3:
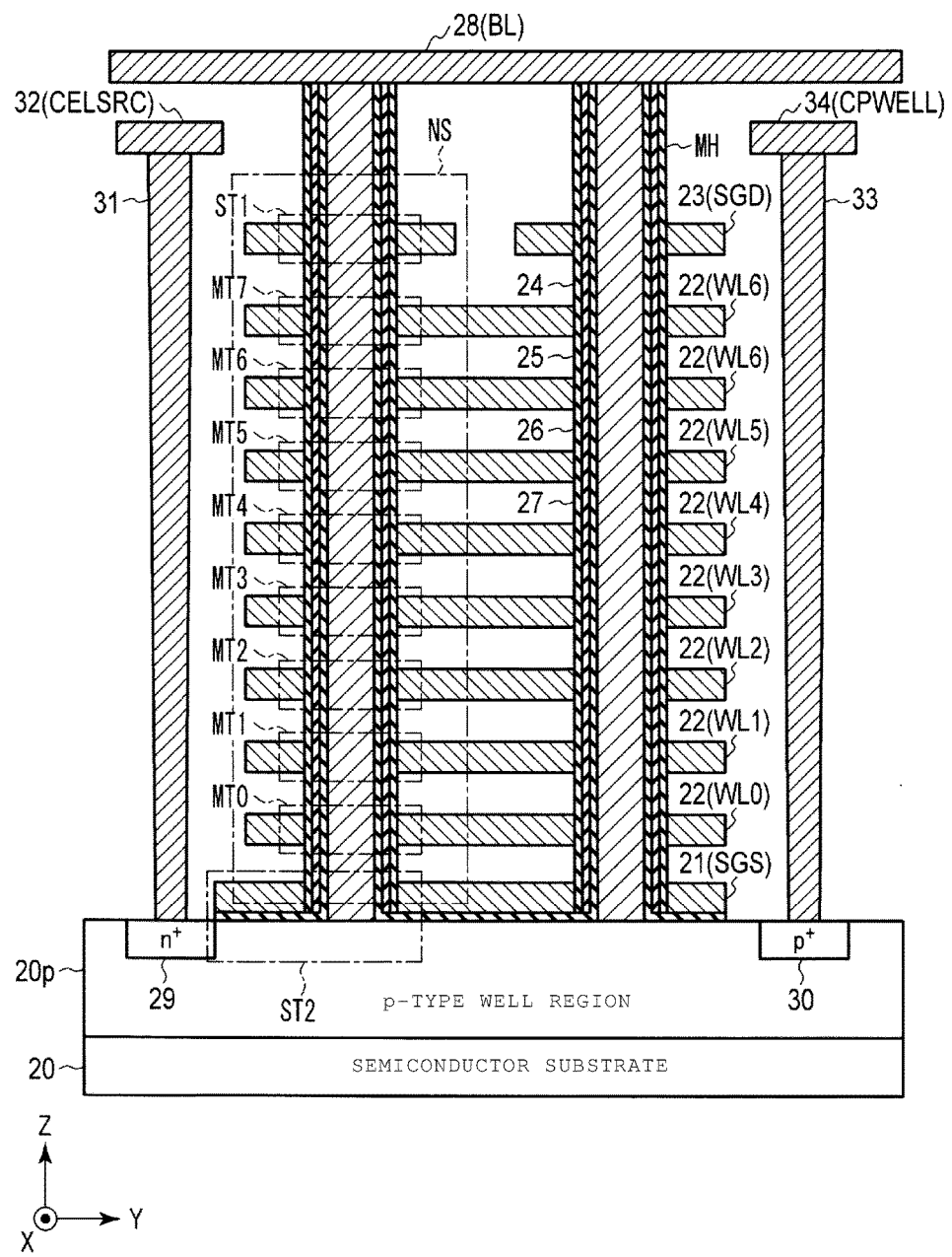
FIG. 3 is a cross-sectional view illustrating the configuration of the memory cell array of the semiconductor memory device according to the first embodiment.

Next, a cross-section structure of the memory cell array 10 is described with reference to FIG. 3. FIG. 3 illustrates an example of a cross-section structure of a portion of the memory cell array of the semiconductor memory device according to the first embodiment. In particular, FIG. 3 illustrates, for example, a portion related to two string units SU in one block BLK. More specifically, FIG. 3 illustrates two NAND strings NS of each of two string units SU arranged side by side in the Y-direction and their surrounding portions. Then, a plurality of structures each illustrated in FIG. 3 is arrayed in the X-direction, and, for example, a set of a plurality of NAND strings NS arranged side by side in the X-direction corresponds to one string unit SU.

The semiconductor memory device 1 is provided on a semiconductor substrate 20. In the following description, a plane parallel to the surface of the semiconductor substrate is referred to as an "XY plane", and a direction perpendicular to the XY plane is referred to as a "Z-direction". Moreover, the X-direction and the Y-direction are assumed to be orthogonal to each other.

A p-type well region 20p is provided at an upper portion of the semiconductor substrate 20. A plurality of NAND strings NS are provided on the p-type well region 20p. In other words, for example, a wiring layer 21, which serves as the select gate line SGS, eight wiring layers 22, which serve as the word lines WL0 to WL7, and a wiring layer 23, which serves as the select gate line SGD, are sequentially stacked in layers on the p-type well region 20p. Each of the wiring layers 21 and 23 can include a plurality of stacked layers. An insulating film (not illustrated) is provided between stacked wiring layers.

The wiring layer 21 electrically connects, for example, the gates of the respective selection transistors ST2 of a plurality of NAND strings NS included in one block BLK. Each of the wiring layers 22 electrically connects the control gates of the respective memory cell transistors MT of a plurality of NAND strings NS included in one block BLK. The wiring layer 23 electrically connects the gates of the respective selection transistors ST1 of a plurality of NAND strings NS included in one string unit SU.

A memory hole MH is formed to extend from a layer located upper than the wiring layer 23, pass through the wiring layers 23, 22, and 21, and extend to the p-type well region 20p along the Z-direction. A block insulating film 24, a charge storage layer (insulating film) 25, and a tunnel oxide film 26 are provided in sequence on the side surface of the memory hole MH. Furthermore, the charge storage layer 25 is not limited to an insulating film, but can be a conductive film serving as a floating gate. A semiconductor pillar (conductive film) 27 is fitted in the memory hole MH. The semiconductor pillar 27 is, for example, non-doped polysilicon, and serves as a current pathway for the NAND string NS. A wiring layer 28, which serves as bit lines BL, is provided on the upper end of the semiconductor pillar 27.

As mentioned above, the selection transistor ST2, the plurality of memory cell transistors MT, and the selection transistor ST1 are stacked in layers in sequence above the p-type well region 20p, and one memory hole MH is associated with one NAND string NS.

An $n^+$-type impurity diffusion region 29 and a $p^+$-type impurity diffusion region 30 are provided in the upper portion of the p-type well region 20p. A contact plug 31 is provided on the upper surface of the $n^+$-type impurity diffusion region 29. A wiring layer 32, which serves as the source line CELSRC, is provided on the upper surface of the contact plug 31. A contact plug 33 is provided on the upper surface of the $p^+$-type impurity diffusion region 30. A wiring layer 34, which serves as a well line CPWELL, is provided on the upper surface of the contact plug 33.

Furthermore, the configuration of the memory cell array 10 can be another configuration. A configuration of the memory cell array 10 is described in, for example, U.S. patent application Ser. No. 12/407,403 filed Mar. 19, 2009, entitled "Three Dimensional Stacked Nonvolatile Semiconductor Memory". Moreover, it is also described in U.S. patent application Ser. No. 12/406,524 filed Mar. 18, 2009, entitled "Three Dimensional Stacked Nonvolatile Semiconductor Memory", U.S. patent application Ser. No. 12/679,991 filed Mar. 25, 2010, entitled "Non-volatile Semiconductor Storage Device and Method of Manufacturing the Same", and U.S. patent application Ser. No. 12/532,030 filed Mar. 23, 2009, entitled "Semiconductor Memory and Method for Manufacturing Same". These patent applications are incorporated by reference in the present disclosure in their entirety.

1.1.3 Layout of Memory Cell Array and Row Decoder

Figure 4:
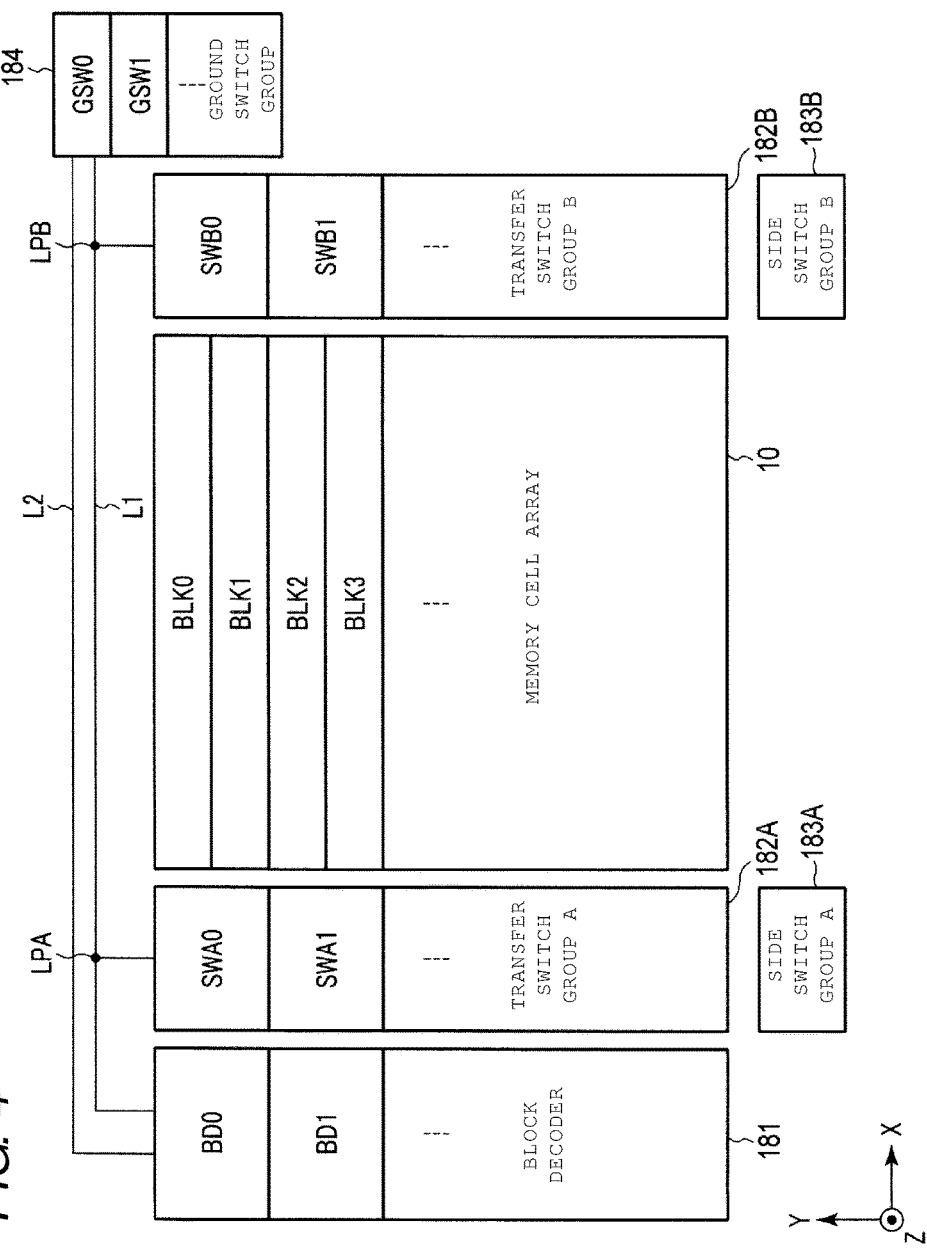
FIG. 4 is a top view illustrating a layout of the memory cell array and a row decoder of the semiconductor memory device according to the first embodiment.

Next, a layout of the memory cell array and the row decoder of the semiconductor memory device according to the first embodiment is described. FIG. 4 is a top view, as viewed from the Z-direction, illustrating an example of a layout of the memory cell array and the row decoder of the semiconductor memory device according to the first embodiment.

As illustrated in FIG. 4, a plurality of blocks BLK included in the memory cell array 10 is arranged side by side in the Y-direction. More specifically, for example, in the memory cell array 10, a block BLK0 is provided at one end side as viewed along the Y-direction, and a plurality of blocks BLK (BLK1, BLK2, . . . ) is provided in ascending order toward the other end side.

A block decoder 181 and a ground switch group 184 are located across the memory cell array 10 along the X-direction. Transfer switch groups 182 (182A and 182B) and side switch groups 183 (183A and 183B) are located at a plurality of regions across the memory cell array 10 along the X-direction. The block decoder 181 is provided, for example, at one side of the memory cell array 10 as viewed along the X-direction. The block decoder 181 includes a plurality of block decoders BD (BD0, BD1, More specifically, for example, in the block decoder 181, a block decoder BD0 is provided at one end side as viewed along the Y-direction, and block decoders BD are provided in ascending order (BD1, BD2, . . . ) toward the other end side. One block decoder BD (BD0, BD1, . . . ) is associated with two blocks BLK (BLK0 and BLK1, BLK2 and BLK3, . . . ).

The transfer switch groups 182 include a transfer switch group 182A and a transfer switch group 182B. The transfer switch group 182A is provided at one end side of the memory cell array 10 as viewed along the X-direction, and the transfer switch group 182B is provided at the other end side thereof. The transfer switch group 182A is provided, for example, between the memory cell array 10 and the block decoder 181 as viewed along the X-direction. The transfer switch group 182A and the transfer switch group 182B respectively include a plurality of transfer switch groups SWA (SWA0, SWA1, . . . ) and a plurality of transfer switch groups SWB (SWB0, SWB1, . . . ). More specifically, for example, in the transfer switch groups SWA and SWB, transfer switch groups SWA0 and SWB0 are respectively provided at one end side as viewed along the Y-direction, and transfer switch groups SWA (SWA1, SWA2, . . . ) and SWB (SWB1, SWB2, . . . ) are respectively provided in ascending order toward the other end side. One transfer switch group SWA or SWB is associated with one block BLK. More specifically, for example, the transfer switch groups SWA (SWA0, SWA1, . . . ) are respectively associated with even-numbered blocks BLK (BLK0, BLK2, . . . ). Moreover, the transfer switch groups SWB (SWB0, SWB1, . . . ) are respectively associated with odd-numbered blocks BLK (BLK1, BLK3, . . . ).

The side switch groups 183 include, for example, a side switch group 183A and a side switch group 183B. The side switch groups 183A and 183B are respectively provided, for example, at the other end side of the transfer switch groups 182A and 182B as viewed along the Y-direction. The side switch groups 183A and 183B are respectively associated with the transfer switch groups 182A and 182B. Furthermore, the side switch groups 183 are not limited to being located at the positions illustrated in FIG. 4, but can be located at optional positions with respect to the transfer switch groups 182.

The ground switch group 184 is located opposite the block decoder 181 across the memory cell array 10 as viewed along the X-direction. The ground switch group 184 includes a plurality of ground transistors GSW (GSW0, GSW1, . . . ). One ground transistor GSW (GSW0, GSW1, . . . ) is associated with two corresponding blocks BLK ((BLK0, BLK1), (BLK2, BLK3), . . . ).

In the case of such an association as mentioned above, the block decoder BD0, the transfer switch groups SWA0 and SWB0, and the ground transistor GSW0 are connected in common, for example, by a wiring L1. Moreover, for example, the block decoder BD0 and the ground transistor GSW0 are connected by a wiring L2. Each of the wirings L1 and L2 includes, for example, a contact extending in the Z-direction and a wiring extending in the X-direction. In this case, the wiring extending in the X-direction can be provided, for example, above the memory cell array 10. The transfer switch group SWA0 is connected to the wiring L1 at a position LPA of the wiring L1. The transfer switch group SWB0 is connected to the wiring L1 at a position LPB of the wiring L1. The positions LPA and LPB are located across the memory cell array 10.

Similarly, the block decoder BD1, the transfer switch groups SWA1 and SWB1, and the ground transistor GSW1 are connected by a wiring (not illustrated) equivalent to the wiring L1, and the block decoder BD1 and the ground transistor GSW1 are connected by a wiring equivalent to the wiring L2. In this way, two wirings (not illustrated) equivalent to the wirings L1 and L2 are provided with respect to every set of one block decoder BD, one pair of transfer switch groups SWA and SWB, and one ground transistor GSW which are associated with one another.

Each of the wirings L1 and L2 has a length enough to pass through the memory cell array 10 in the X-direction. Therefore, the wire diameter of each of the wirings L1 and L2 (for example, several nanometers) is very small as compared to the length thereof in the X-direction (for example, several millimeters).

1.1.4 Configuration of Row Decoder

Next, a configuration of the row decoder of the semiconductor memory device according to the first embodiment is described.

Figure 5:
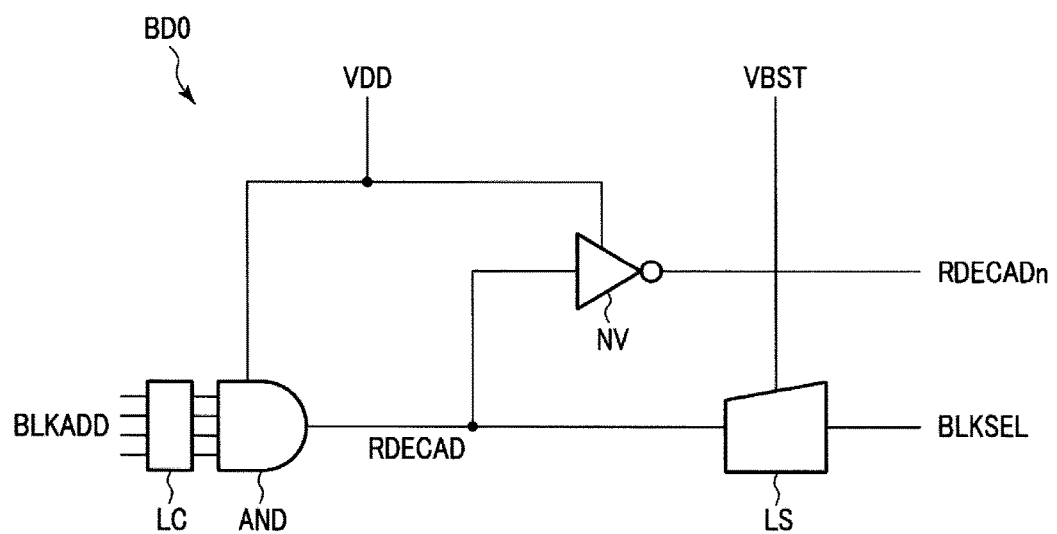
FIG. 5 is a circuit diagram illustrating a configuration of a block decoder of the semiconductor memory device according to the first embodiment.

FIG. 5 is a circuit diagram illustrating an example of a configuration of the block decoder of the semiconductor memory device according to the first embodiment. As illustrated in FIG. 5, the block decoder BD0 includes a logic circuit LC, a logical product circuit AND, an inverter NV, and a level shifter LS.

The logic circuit LC generates output signals based on block address signals BLKADD input from the register 14. The logic circuit LC generates the output signals all of which are at "H" level with respect to a block decoder BD0 for which the block address signals BLKADD are hit, and generates the output signals anyone of which is at "L" level with respect to a block decoder BD0 for which the block address signals BLKADD are not hit. The logical product circuit AND outputs a logical product result of the output signals of the logic circuit LC as a post-decode signal RDECAD to the inverter NV and the level shifter LS. Thus, in the block decoder BD0 for which the block address signals BLKADD are hit, the post-decode signal RDECAD is output at "H (High)" level. Moreover, in the block decoder BD0 for which the block address signals BLKADD are not hit, the post-decode signal RDECAD is output at "L (Low)" level.

The inverter NV inverts the post-decode signal RDECAD output from the logical product circuit AND. As a result of the inversion, the inverter NV outputs a post-decode inversion signal RDECADn to the wiring L2.

Furthermore, the logical product circuit AND and the inverter NV are activated, for example, by a power-supply voltage VDD (for example, 2V). Therefore, the post-decode signal RDECAD and the post-decode inversion signal RDECADn which are at "H" level have a voltage value of, for example, about 2 V.

The level shifter LS boosts the voltage value of the input post-decode signal RDECAD to an appropriate voltage value while setting a boost voltage VBST (for example, 30 V) as a target voltage. As a result of the boosting, the level shifter LS outputs a block selection signal BLKSEL to the wiring L1. More specifically, when the post-decode signal RDECAD is input at "H" level, the level shifter LS outputs the boost voltage VBST as the block selection signal BLKSEL which is at "H" level. When the post-decode signal RDECAD is input at "L" level, the level shifter LS outputs a ground voltage VSS (for example, 0 V) as the block selection signal BLKSEL which is at "L" level. The boost voltage VBST is a voltage value larger than the ground voltage VSS, and is a voltage value larger than a writing voltage VPGM (for example, 20 V) which is applied to the gate of the memory cell transistor MT during writing of data.

With the above-mentioned configuration, the block decoder BD0 outputs the block selection signal BLKSEL, which varies in voltage value in the case of "H" level, to the wiring L1, and outputs the post-decode inversion signal RDECADn to the wiring L2. The block selection signal BLKSEL and the post-decode inversion signal RDECADn have a relationship of inversion signals in which when one is at "H" level, the other is at "L" level. In other words, the block selection signal BLKSEL and the post-decode inversion signal RDECADn which are output at the same time have respective different logic levels.

Figure 6:
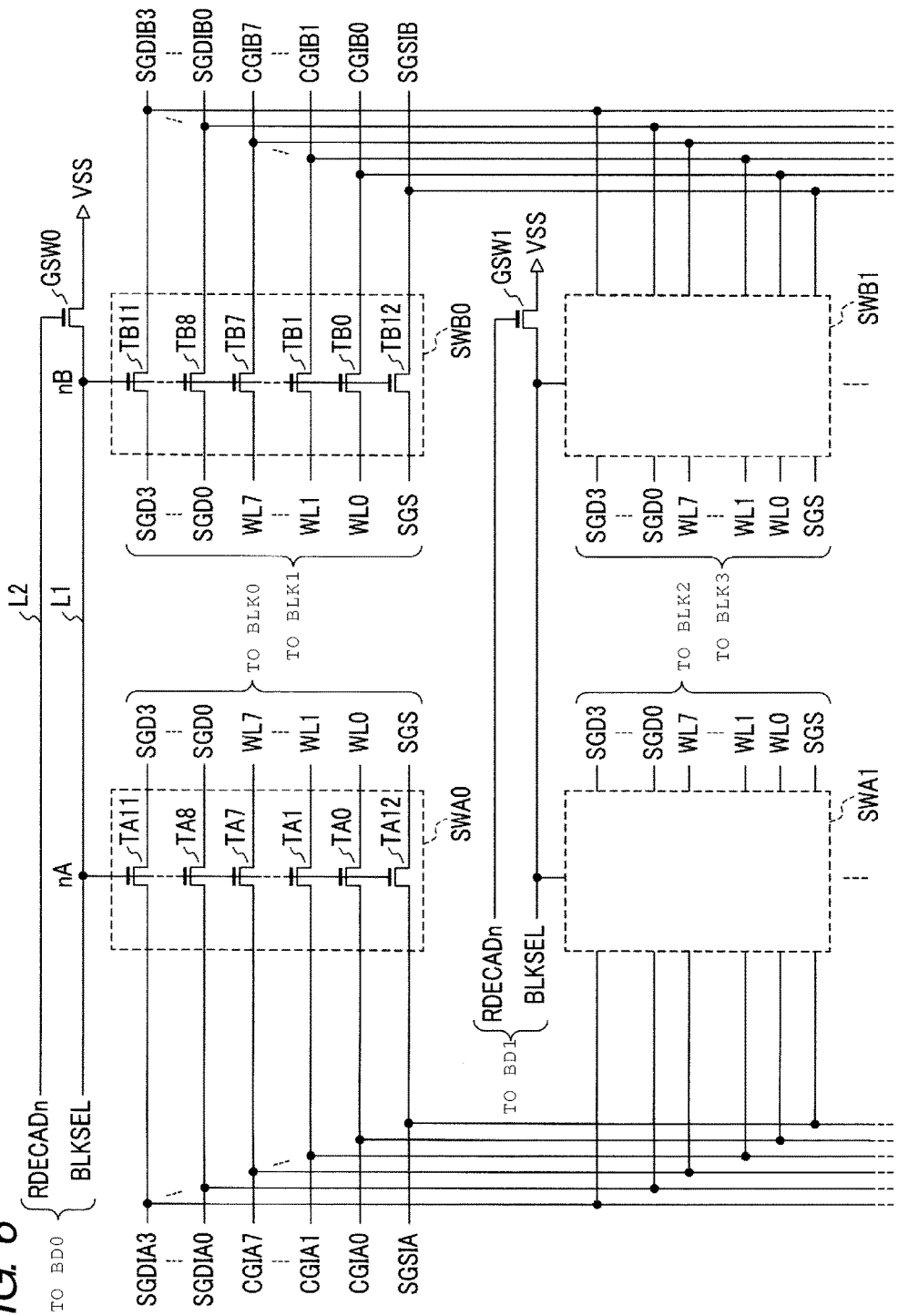
FIG. 6 is a circuit diagram illustrating configurations of a transfer switch group and a ground transistor of the semiconductor memory device according to the first embodiment.

FIG. 6 is a circuit diagram illustrating an example of configurations of the transfer switch group and the ground transistor of the semiconductor memory device according to the first embodiment. FIG. 6 illustrates, by way of example, a set of the transfer switch groups SWA0 and SWB0 and the ground transistor GSW0, which are connected to the block decoder BD0, and a set of the transfer switch groups SWA1 and SWB1 and the ground transistor GSW1, which are connected to the block decoder BD1.

As illustrated in FIG. 6, for example, the ground (not illustrated) is connected to one end of the ground transistor GSW0, to which the ground voltage VSS is supplied. The wiring L1 is connected to the other end of the ground transistor GSW0. The post-decode inversion signal RDECADn is transferred to the gate of the ground transistor GSW0 via the wiring L2. Thus, when the post-decode inversion signal RDECADn is at "H" level, the ground transistor GSW0 enters an on-state, thus transferring the ground voltage VSS to the wiring L1. On the other hand, when the post-decode inversion signal RDECADn is at "L" level, the ground transistor GSW0 enters an off-state, thus disconnecting the ground (not illustrated) and the wiring L1 from each other.

The block selection signal BLKSEL is transferred to the transfer switch groups SWA0 and SWB0 and the other end of the ground transistor GSW0 via the wiring L1. The transfer switch groups SWA0 and SWB0 respectively include a plurality of transfer transistors TA (TA0 to TA12) and a plurality of transfer transistors TB (TB0 to TB12). The gates of the respective transfer transistors TA and TB (hereinafter also referred to as "Transfer-G") are connected to the wiring L1 in common at nodes nA and nB located between the block decoder BD0 and the ground transistor GSW0 on the wiring L1. The nodes nA and nB are nodes at the respective positions LPA and LPB. The transfer transistors TA and TB enter an on-state when the block selection signal BLKSEL is at "H" level, and enter an off-state when the block selection signal BLKSEL is at "L" level.

As mentioned above, the block selection signal BLKSEL and the post-decode inversion signal RDECADn have respective different logic levels. Thus, the wiring L1 is used to transfer the ground voltage VSS when the ground transistor GSW0 is in an on-state and to transfer the boost voltage VBST when the ground transistor GSW0 is in an off-state.

Wirings CGIA (CGIA0 to CGIA7), SGDIA (SGDIA0 to SGDIA3), and SGSIA are respectively connected to the blocks BLK (BLK0, BLK2, . . . ) via the transfer switch groups SWA (SWA0, SWA1, . . . ). More specifically, the wirings CGIA0 to CGIA7 are respectively connected to the word lines WL0 to WL7 of the block BLK0 via the transfer transistors TA0 to TA7 of the transfer switch group SWA0. The wirings SGDIA0 to SGDIA3 are respectively connected to the select gate lines SGD0 to SGD3 of the block BLK0 via the transfer transistors TA8 to TA11 of the transfer switch group SWA0. The wiring SGSIA is connected to the select gate line SGS of the block BLK0 via the transfer transistor TA12 of the transfer switch group SWA0.

Wirings CGIB (CGIB0 to CGIB7), SGDIB (SGDIB0 to SGDIB3), and SGSIB are respectively connected to the blocks BLK (BLK1, BLK3, . . . ) via the transfer switch groups SWB (SWB0, SWB1, . . . ). More specifically, the wirings CGIB0 to CGIB7 are respectively connected to the word lines WL0 to WL7 of the block BLK1 via the transfer transistors TB0 to TB7 of the transfer switch group SWB0. The wirings SGDIB0 to SGDIB3 are respectively connected to the select gate lines SGD0 to SGD3 of the block BLK1 via the transfer transistors TB8 to TB11 of the transfer switch group SWB0. The wiring SGSIB is connected to the select gate line SGS of the block BLK1 via the transfer transistor TB12 of the transfer switch group SWB0.

With the above-mentioned configuration, by the block selection signal BLKSEL which is output from the block decoder BD0, the transfer transistors TA and TB, which respectively transfer voltages to the blocks BLK0 and BLK1, enter an on-state at the same time. In other words, the block decoder BD0 selects the block BLK0 and the block BLK1 at the same time. In this case, voltages on the wirings CGIA, SGDIA, and SGSIA are transferred to the block BLK0, and voltages on the wirings CGIB, SGDIB, and SGSIB are transferred to the block BLK1.

The same also applies to the blocks BLK2 and BLK3, so that the block decoder BD1 for the blocks BLK2 and BLK3 selects the blocks BLK2 and BLK3 at the same time using the corresponding block selection signal BLKSEL. The same also applies to the other pairs of blocks BLK.

Figure 7:
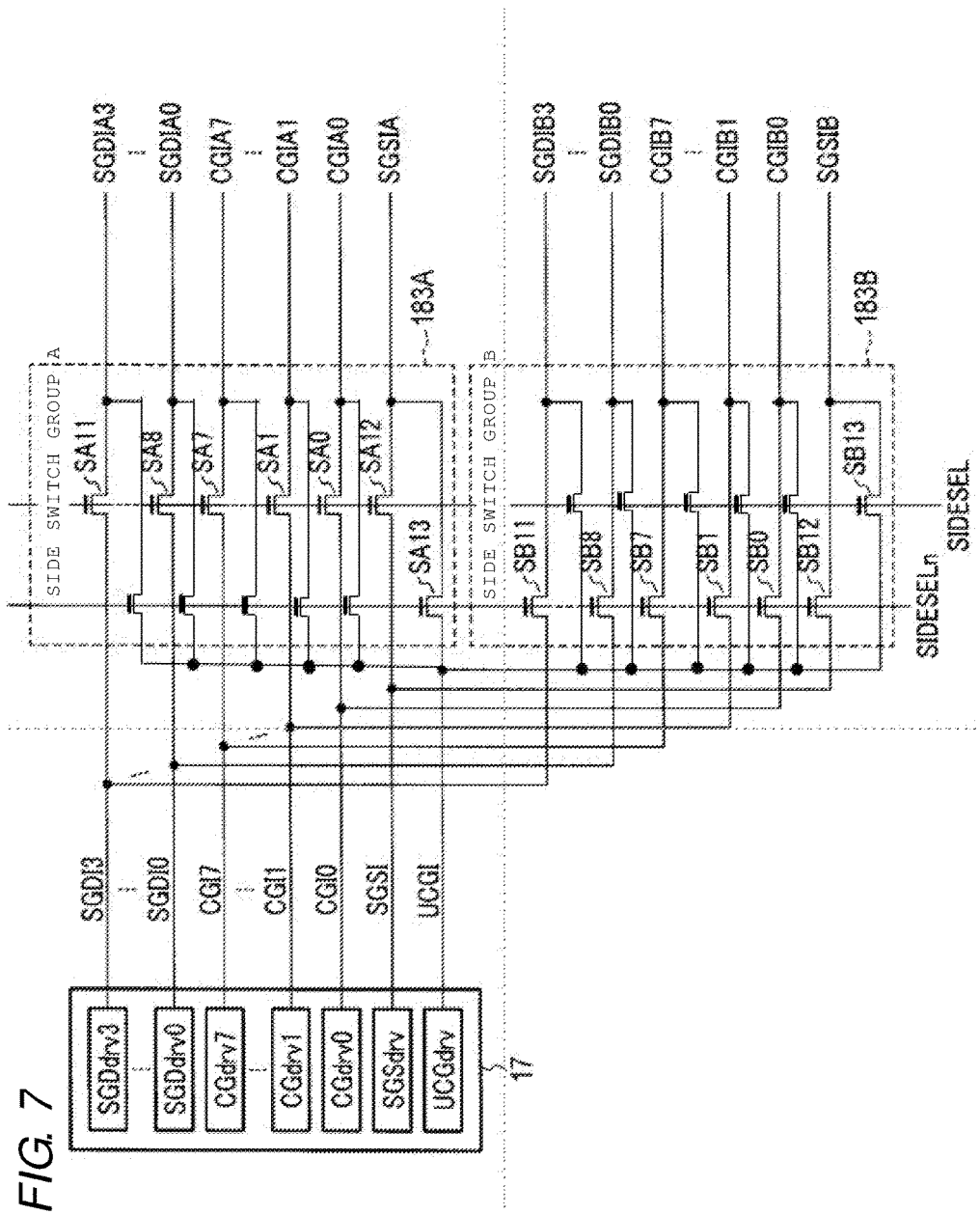
FIG. 7 is a circuit diagram illustrating a configuration of a side switch group of the semiconductor memory device according to the first embodiment.

FIG. 7 is a circuit diagram illustrating an example of a configuration of the side switch group of the semiconductor memory device according to the first embodiment. As illustrated in FIG. 7, the side switch groups 183A and 183B respectively include side transistors SA (SA0 to SA13) and SB (SB0 to SB13). The driver set 17 includes drivers CGdrv (CGdrv0 to CGdrv7), SGDdrv (SGDdrv0 to SGDdrv3), SGSdrv, and UCGdrv. Each of the drivers CGdrv, SGDdrv, SGSdrv, and UCGdrv is able to output a voltage independently.

The wirings CGIA0 to CGIA7 are respectively connected to wirings CGI0 to CGI7 via the side transistors SA0 to SA7. The wirings SGDIA0 to SGDIA3 are respectively connected to wirings SGDI0 to SGDI3 via the side transistors SA8 to SA11. The wiring SGSIA is connected to a wiring SGSI via the side transistor SA12. Moreover, the wirings CGIA, SGDIA, and SGSIA are connected to a wiring UCGI via a plurality of transistors. For example, the wiring SGSIA is connected to the wiring UGGI via the transistor SA13.

The wirings CGIB0 to CGIB7 are respectively connected to the wirings CGI0 to CGI7 via the side transistors SB0 to SB7. The wirings SGDIB0 to SGDIB3 are respectively connected to the wirings SGDI0 to SGDI3 via the side transistors SB8 to SB11. The wiring SGSIB is connected to the wiring SGSI via the side transistor SB12. Moreover, the wirings CGIB, SGDIB, and SGSIB are connected to the wiring UCGI via a plurality of side transistors. For example, the wiring SGSIB is connected to the wiring UGGI via the transistor SB13.

The wirings CGI0 to CGI7 are respectively driven by the drivers CGdrv0 to CGdrv7. The wirings SGDI0 to SGDI3 are respectively driven by the drivers SGDdrv0 to SGDdrv3. The wiring SGSI is driven by the driver SGSdrv. The wiring UCGI is driven by the driver UCGdrv.

A common signal SIDESEL is input to the gates of the side transistors SA0 to SA12 and SB13. Thus, the side transistors SA0 to SA12 and SB13 enter an on-state when the signal SIDESEL is at "H" level and enter an off-state when the signal SIDESEL is at "L" level.

A common signal SIDESELn is input to the gates of the side transistors SB0 to SB12 and SA13. Thus, the side transistors SB0 to SB12 and SA13 enter an on-state when the signal SIDESELn is at "H" level and enter an off-state when the signal SIDESELn is at "L" level.

The signal SIDESELn and the signal SIDESEL have respective different logic levels. Furthermore, according to the example illustrated in FIGS. 6 and 7, the signal SIDESEL and the signal SIDESELn have the function of selecting the even-numbered blocks BLK (BLK0, BLK2, . . . ) and the odd-numbered blocks BLK (BLK1, BLK3, . . . ). In this case, the signal SIDESEL and the signal SIDESELn are able to be implemented by, for example, the least significant bit of the block address signal BLKADD being input, but can be implemented by another method.

With the above-mentioned configuration, when the signal SIDESEL is at "H" level (and the signal SIDESELn is at "L" level), voltages output from the drivers CGDdrv, SGDdrv, and SGSdry are transferred to the wirings CGIA, SGDIA, and SGSIA via the side switch group 183A. A voltage output from the driver UCGdry is transferred to the wirings CGIB, SGDIB, and SGSIB via the side switch group 183B. In this case, the wirings CGIA, SGDIA, and SGSIA are selected, and the wirings CGIB, SGDIB, and SGSIB are not selected.

Moreover, when the signal SIDESELn is at "H" level (and the signal SIDESEL is at "L" level), voltages output from the drivers CGDdrv, SGDdrv, and SGSdry are transferred to the wirings CGIB, SGDIB, and SGSIB via the side switch group 183B. A voltage output from the driver UCGdry is transferred to the wirings CGIA, SGDIA, and SGSIA via the side switch group 183A. In this case, the wirings CGIB, SGDIB, and SGSIB are selected, and the wirings CGIA, SGDIA, and SGSIA are not selected.

1.2 Advantageous Effect of the Present Embodiment

According to the first embodiment, erroneous writing during a writing operation can be reduced. This advantageous effect is described as follows.

In a case where a semiconductor memory device has such a configuration that one block decoder is used to select two blocks, transfer switch groups are located at two regions across a memory cell array. Two transfer switch groups located at the two regions are connected to one block decoder via a certain wiring. The certain wiring is located while passing over the memory cell array and, therefore, has a very long wire length as compared to its wire diameter. On such a wiring, the possibility of occurrence of step-cuts increases. If step-cuts occur on a wiring, the wiring is electrically disconnected or brought into a high-resistance state at the portion where step-cuts occur. This causes the wiring with step-cuts occurring to lose or reduce the function of transferring a voltage from one end to the other end at appropriate timing. Step-cuts are caused by various factors, such as mixing of dust, electro-migration, and stress-migration. Mixing of dust may occur, for example, during the process for producing a wiring layer.

Electro-migration may occur, for example, due to a high voltage being applied to a wiring. Stress-migration may occur, for example, due to a physical or thermal stress being applied to a wiring.

Figure 8:
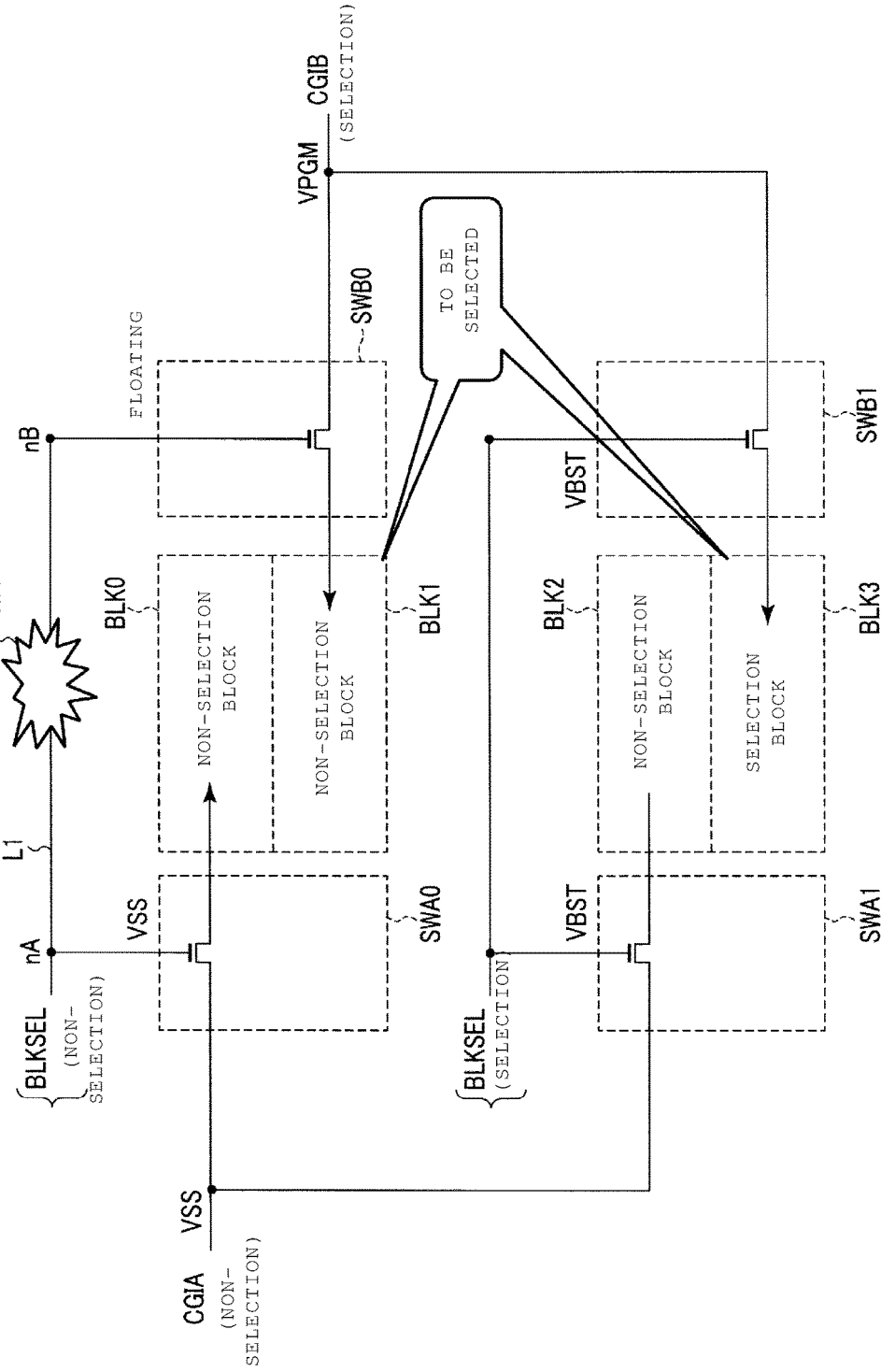
FIG. 8 is a schematic view illustrating the related art.

FIG. 8 is a schematic view illustrating the related art. FIG. 8 schematically illustrates a behavior in a case where data writing is performed with step-cuts occurring on a wiring in a semiconductor memory device having a configuration in which two blocks are selected by one block decoder as mentioned above. In the example illustrated in FIG. 8, blocks BLK0 to BLK2 are non-selection blocks, and a block BLK3 is a selection block. Moreover, step-cuts ANM1 occur between the node nA connected to the transfer switch group SWA0 and the node nB connected to the transfer switch group SWB0 on the wiring L1. Furthermore, in FIG. 8, a wiring CGIA used to transfer a voltage VPGM, among the wirings CGIA, SGDIA, and SGSIA, is illustrated as a representative. Moreover, a wiring CGIB used to transfer the voltage VPGM, among the wirings CGIB, SGDIB, and SGSIB, is illustrated as a representative. Then, a phenomenon described as follows with respect to the wiring CGIB used to transfer the voltage VPGM occurs similarly also in the other wirings CGIB, SGDIB, and SGSIB.

As illustrated in FIG. 8, the wiring CGIA is in a state of not being selected and is used to transfer the ground voltage VSS. The wiring CGIB is in a state of being selected and is used to transfer the writing voltage VPGM. Moreover, the block decoder BD1 outputs a boost voltage VBST as the block selection signal BLKSEL. Thereby, the transfer transistors included in the transfer switch groups SWA1 and SWB1 enter an on-state, so that data is not written into the block BLK2 and is written into only the block BLK3.

On the other hand, the block decoder BD0 outputs the ground voltage VSS as the block selection signal BLKSEL. Thereby, the transfer transistors included in the transfer switch group SWB0 enter an off-state, so that data is not transferred to the block BLK1. However, since step-cuts ANM1 occur between the node nA and the node nB on the wiring L1, the node nB enters a floating state. The node nB in the floating state can have a voltage higher than the ground voltage VSS owing to coupling with another wiring (not illustrated). Therefore, since the transfer transistors included in the transfer switch group SWB0 do not sufficiently remain in an off-state, a voltage on the wiring CGIB in a selected state may be transferred to the block BLK1 at least to some extent. Thus, a state occurs in which two blocks BLK1 and BLK3 are connected to the wiring CGIB.

In such a state, the capacity for the wiring CGIB is higher than that in the state in which only one block BLK is connected to the wiring CGIB. Therefore, since the voltage on the wiring CGIB does not sufficiently increase, writing to the selection block BLK3 may be failed. The phenomenon in which two blocks BLK are selected in this way does not disappear even in a case where the block BLK1 is registered as a bad block. Therefore, since a semiconductor memory device in which the selection of a plurality of blocks BLK occurs due to step-cuts as mentioned above has to be handled as a defective product (chip kill) regardless of the fact that step-cuts occur only at one portion, it results in a decrease in yield ratio.

Thus, in a semiconductor memory device of the related art, there is room for considering a point that a plurality of blocks BLK may be selected in a case where step-cuts occur on a wiring in a concurrent manner.

Figure 9:
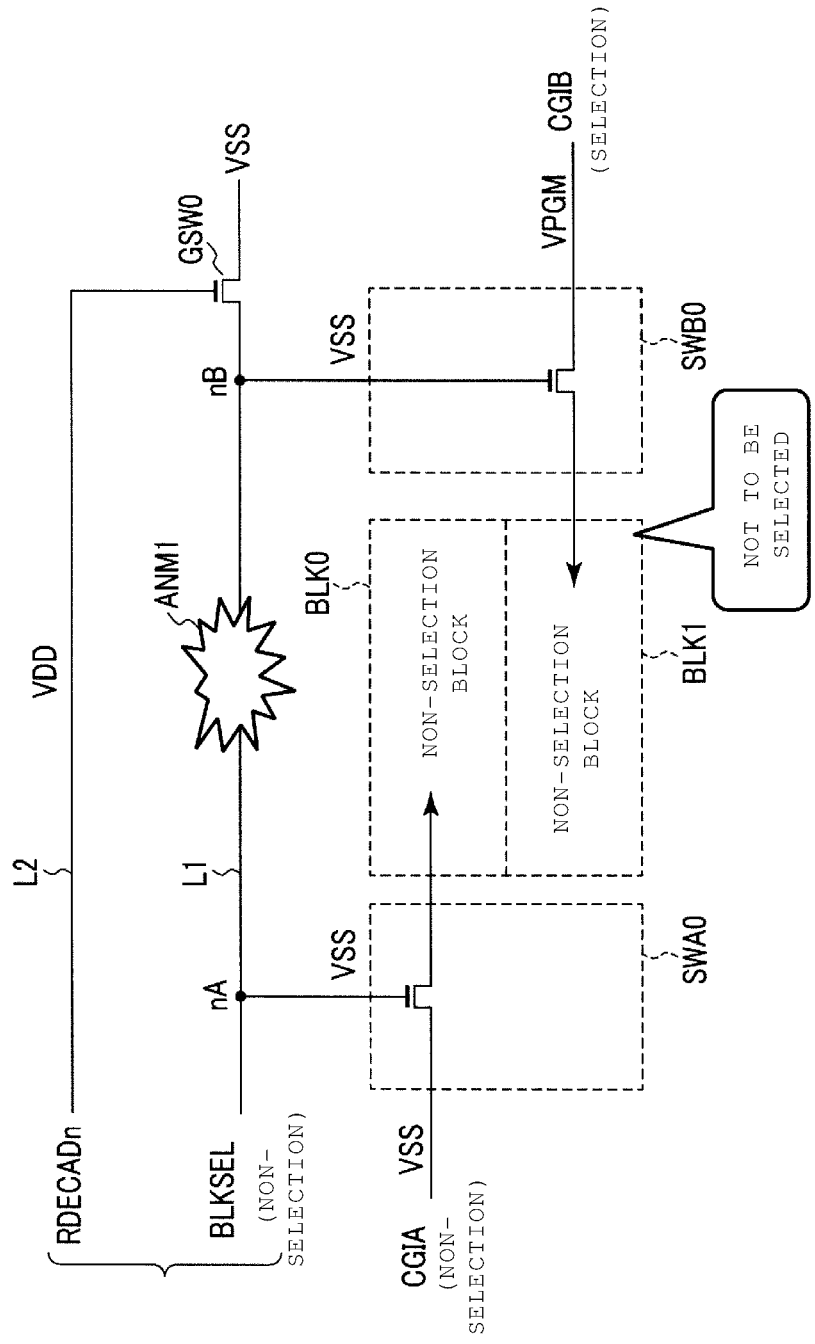
FIG. 9 is a schematic view illustrating an advantageous effect of the semiconductor memory device according to the first embodiment.

FIG. 9 is a schematic view illustrating an advantageous effect of the semiconductor memory device according to the first embodiment. Referring to FIG. 9, as in FIG. 8, step-cuts ANM1 occur between the node nA and the node nB on the wiring L1. Moreover, in FIG. 9, the blocks BLK0 and BLK1 are blocks that are targeted for non-writing.

As illustrated in FIG. 9, the block decoder BD0 outputs the ground voltage VSS as the block selection signal BLKSEL. The block selection signal BLKSEL is transferred to the transfer switch group SWA0 via the node nA. Thereby, the transfer transistors included in the transfer switch group SWA0 enter an off-state. On the other hand, the block selection signal BLKSEL does not reach the node nB due to occurrence of step-cuts ANM1, and is, therefore, not transferred to the transfer switch group SWB0.

The semiconductor memory device according to the first embodiment, which is a semiconductor memory device having a configuration in which one block decoder is used to select two blocks, is provided with the ground transistor GSW0. The ground transistor GSW0 has one end to which the ground voltage VSS is supplied and the other end to which the wiring L1 is connected. The transfer switch groups SWA0 and SWB0 are connected between the other end of the ground transistor GSW0 and the block decoder BD0 on the wiring L1. The ground transistor GSW0 enters an on-state in a case where the block selection signal BLKSEL is at "L" level.

Therefore, in a case where the block selection signal BLKSEL is an output at "L" level, the ground voltage VSS supplied from the other end of the ground transistor GSW0 is transferred to the wiring L1 at the side of the node nB. In other words, even in a case where step-cuts ANM1 occur on the wiring L1, the ground voltage VSS is transferred to the transfer switch group SWB0 via the node nB. Thereby, all of the transfer transistors included in the transfer switch groups SWA0 and SWB0 enter an off-state and thus setting each of the blocks BLK0 and BLK1 as a non-selection block. Accordingly, even in a case where step-cuts ANM1 occur on the wiring L1, a plurality of blocks BLK can be prevented from being selected in a concurrent manner.

Furthermore, according to a first aspect of the first embodiment, the gate of the ground transistor GSW0 receives the post-decode inversion signal RDECADn via the wiring L2. As mentioned above, the post-decode inversion signal RDECADn is a signal obtained by inverting the post-decode signal RDECAD, which is a signal obtained after decoding by the logic circuit LC and the logical product circuit AND and before being boosted by the level shifter LS. Thus, the post-decode inversion signal RDECADn has a voltage value at "H" level that is approximately equivalent to the power-supply voltage VDD, which is lower than the boost voltage VBST. Therefore, the magnitude of the voltage applied to the wiring L2 is approximately equivalent to the power-supply voltage VDD, so that a high voltage can be prevented from being applied to the wiring L2. This enables reducing the risk of occurrence of electro-migration, which is one of principal factors of step-cuts, with respect to the wiring L2. Accordingly, a plurality of blocks BLK can be prevented from being selected in a concurrent manner. Furthermore, the block decoder BD0 corresponding to a non-selection block BLK generates an output at "H" level as the post-decode inversion signal RDECADn. Therefore, the post-decode inversion signal RDECADn may be used so that the selection gate of the non-selection block BLK enters an off-state. In other words, the post-decode inversion signal RDECADn may be generated as an existing signal. In this case, the post-decode inversion signal RDECADn does not need to be generated as a new signal so as to be prepared for the configuration of the first embodiment. Therefore, the chip size can be prevented from increasing.

Furthermore, according to a second aspect of the first embodiment, the post-decode inversion signal RDECADn and the block selection signal BLKSEL have respective different logic levels. Therefore, in a case where the block selection signal BLKSEL is at "L" level, an "H" level signal is automatically input to the gate of the ground transistor GSW0, so that the ground transistor GSW0 enters an on-state. Accordingly, a plurality of blocks BLK can be prevented from being selected in a concurrent manner. Moreover, since the wiring L2 is an existing wiring, no new wiring does not need to be laid. Therefore, the chip size can be prevented from increasing.

Figure 10:
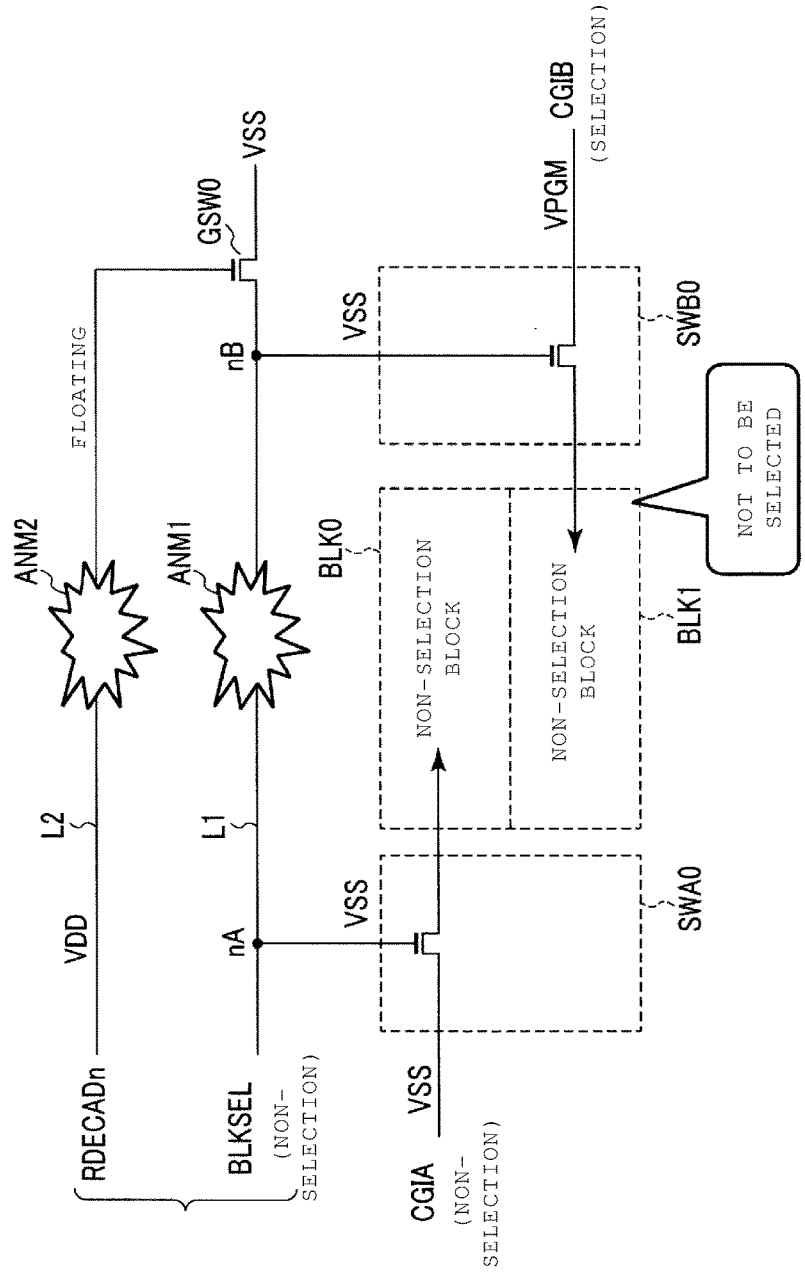
FIG. 10 is a schematic view illustrating an advantageous effect of the semiconductor memory device according to the first embodiment.

Furthermore, in the semiconductor memory device according to the first embodiment, in a case where step-cuts ANM2 occur on the wiring L2 in addition to step-cuts ANM1 occurring on the wiring L1, erroneous writing to a non-selection block can also be reduced. FIG. 10 is a schematic view illustrating an advantageous effect of the semiconductor memory device according to the first embodiment. Referring to FIG. 10, in addition to the state illustrated in FIG. 9, step-cuts ANM2 also occur on the wiring L2.

As illustrated in FIG. 10, in a case where step-cuts ANM2 additionally occur on the wiring L2, the post-decode inversion signal RDECADn is not transferred to the gate of the ground transistor GSW0 due to occurrence of step-cuts ANM2. Therefore, besides the node nB, the gate of the ground transistor GSW0 enters a floating state. The potential of each of the node nB and the gate of the ground transistor GSW0, which are in a floating state, can be increased up to the potential higher than "L" level owing to coupling with another wiring (not illustrated). However, in a case where the potential of the gate of the ground transistor GSW0 rises beyond "L" level (VSS) and exceeds the threshold voltage of the ground transistor GSW0, the ground transistor GSW0 enters an on-state. Therefore, the ground voltage VSS is transferred to the node nB via the ground transistor GSW0, so that the floating state disappears. With this, the ground voltage VSS is transferred to the transfer switch group SWB0 via the node nB, so that the writing voltage VPGM can be prevented from being transferred from the wiring CGIB to the block BLK1. Accordingly, even in a case where step-cuts ANM1 and ANM2 occur on the wiring L1 and the wiring L2, respectively, a plurality of blocks BLK can be prevented from being selected in a concurrent manner.

Moreover, the wiring L2 has a length enough to pass over the memory cell array 10 along the X-direction so as to connect the block decoder BD0 and the ground transistor GSW0. Therefore, on the wiring L2, step-cuts can occur with the probability equivalent to that on the wiring L1. However, the probability with which step-cuts concurrently occur on both the wiring L1 and the wiring L2 takes a value obtained by multiplying the probability with which step-cuts occur on the wiring L1 by the probability with which step-cuts occur on the wiring L2, and is, therefore, extremely lower than the probability with which step-cuts occur on only one of the wiring L1 and the wiring L2. Therefore, the probability itself with which step-cuts ANM1 and ANM2 occur on the wiring L1 and the wiring L2, respectively, can be kept low, and a plurality of blocks BLK can be further prevented from being selected in a concurrent manner.

Furthermore, while, in FIG. 9 and FIG. 10, a case has been described in which data is written, the semiconductor memory device according to the first embodiment can similarly prevent a plurality of blocks BLK from being selected in a concurrent manner even in the case of data reading and erasure.

2. Second Embodiment

Next, a semiconductor memory device according to a second embodiment is described. In the semiconductor memory device according to the second embodiment, instead of the ground transistor GSW, a ground switch GSWa, which is other than a transistor, is provided to prevent erroneous writing to a non-selection block. In the following description, components similar to those of the first embodiment are assigned the respective same reference characters and are omitted from the description, and only portions different from those in the first embodiment are described.

2.1 Configuration of Ground Switch Group

Figure 11:
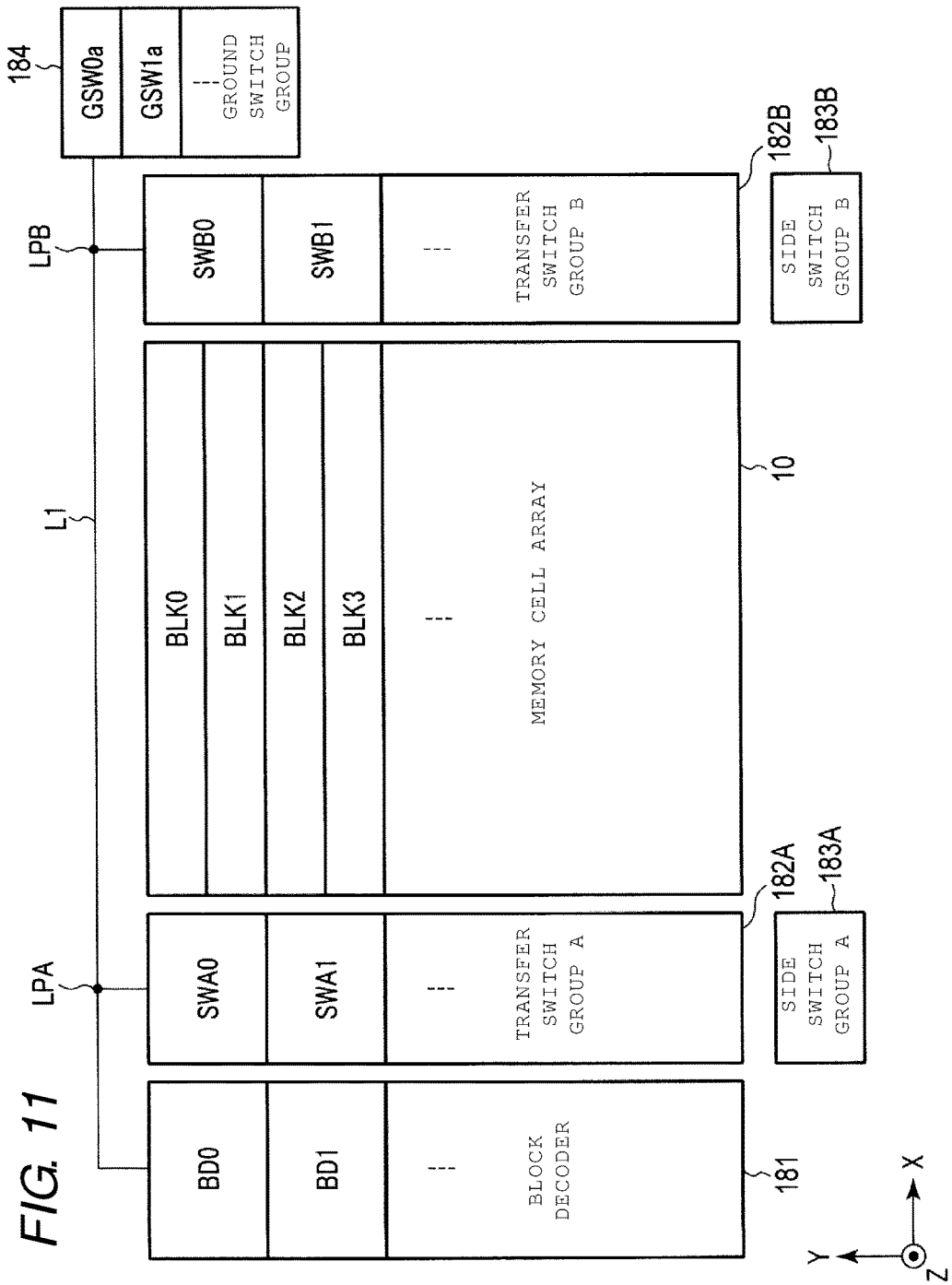
FIG. 11 is a top view illustrating a layout of a memory cell array and a row decoder of a semiconductor memory device according to a second embodiment.

FIG. 11 is a plan view, as viewed from the Z-direction, illustrating an example of a planar layout of a memory cell array and a row decoder of the semiconductor memory device according to the second embodiment. As illustrated in FIG. 11, a ground switch group 184 includes a plurality of ground switches GSWa (GSW0a, GSW1a, ...).

The ground switch GSWa is, for example, an element which constantly electrically connects the wiring L1 and the ground (not illustrated). In a case where there is a potential difference between the wiring L1 and the ground (not illustrated), a weak current flows from the wiring L1 via the ground switch GSWa. However, the magnitude of the current is adjusted to a small value to such an extent as not to disturb normal operations of the transfer switch groups SWA and SWB. The ground switch GSWa includes, for example, a high-resistance element and a constant current switch. One ground switch GSWa (GSW0a, GSW1a, ...) is respectively associated with one block BLK (BLK0, BLK1, ...).

With the above-mentioned association, the block decoder BD0, transfer switch groups SWA0 and SWB0, and the ground switch GSW0a are connected in common, for example, by the wiring L1. The semiconductor memory device according to the second embodiment differs from the semiconductor memory device according to the first embodiment in that the block decoder 181 and the ground switch 184 are not connected by the wiring L2.

Figure 12:
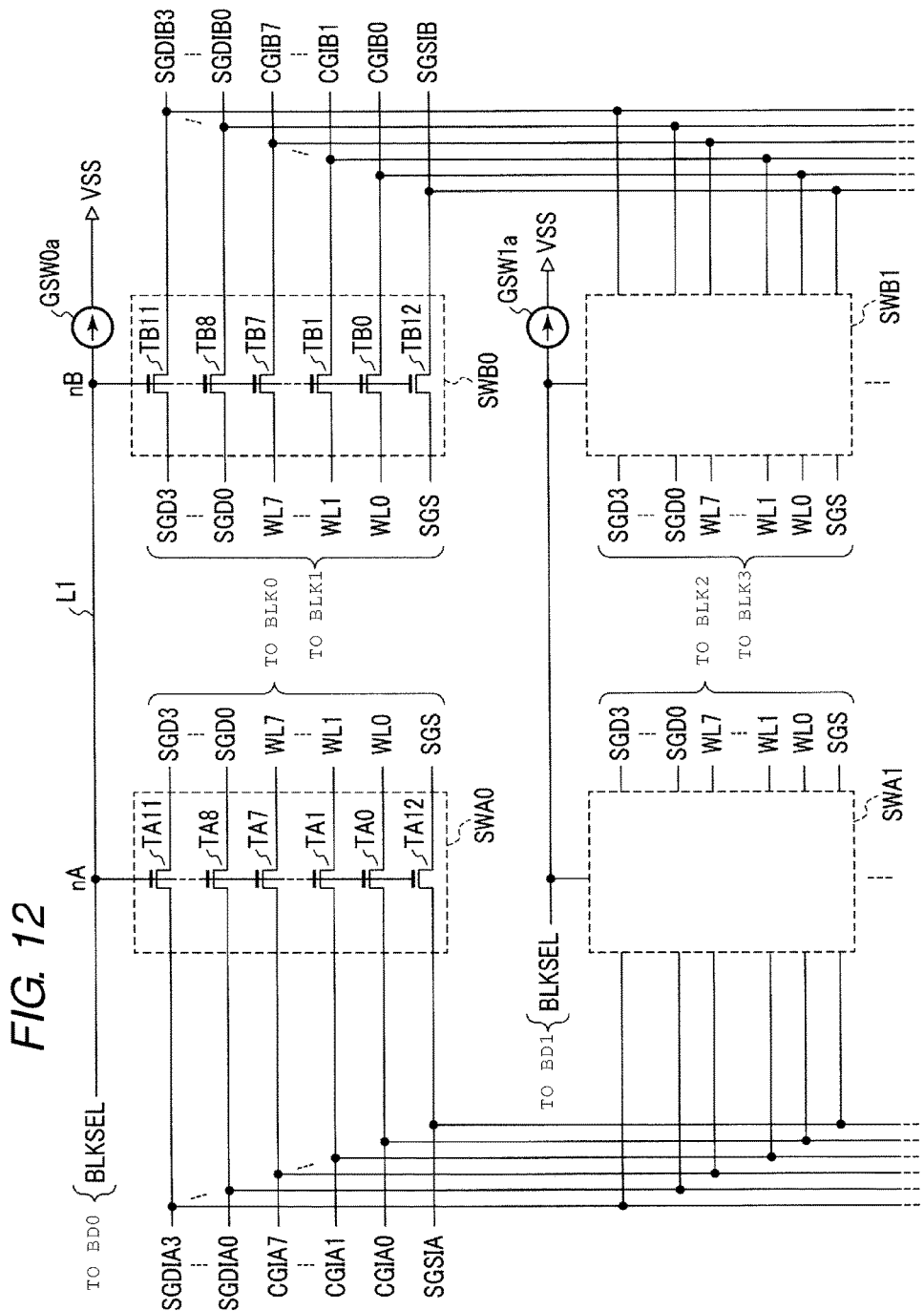
FIG. 12 is a circuit diagram illustrating configurations of a transfer switch group and a ground switch of the semiconductor memory device according to the second embodiment.

FIG. 12 is a circuit diagram illustrating an example of configurations of transfer switch groups and ground switches of the semiconductor memory device according to the second embodiment. FIG. 12 illustrates, by way of example, a set of the transfer switch groups SWA0 and SWB0 and the ground switch GSW0a, which are connected to the block decoder BD0, and a set of the transfer switch groups SWA1 and SWB1 and the ground switch GSW1a, which are connected to the block decoder BD1.

As illustrated in FIG. 12, the ground voltage VSS is supplied to one end of the ground switch GSW0a. The wiring L1 is connected to the other end of the ground switch GSW0a. In other words, the ground switch GSW0a is constantly in an on-state and thus causes a current from the wiring L1 to leak to such an extent as not to disturb normal operations of the transfer switch groups SWA0 and SWB0. On the other hand, for example, in a case where the wiring L1 is in a floating state with respect to the block decoder BD0, the ground switch GSW0a transfers the ground voltage VSS to the wiring L1. In other words, when the wiring L1 is connected to the block decoder BD0, the block selection signal BLKSEL is transferred to the wiring L1. When the wiring L1 is in a floating state with respect to the block decoder BD0, the ground voltage VSS is transferred to the wiring L1.

2.2 Advantageous Effect of the Present Embodiment

Figure 13:
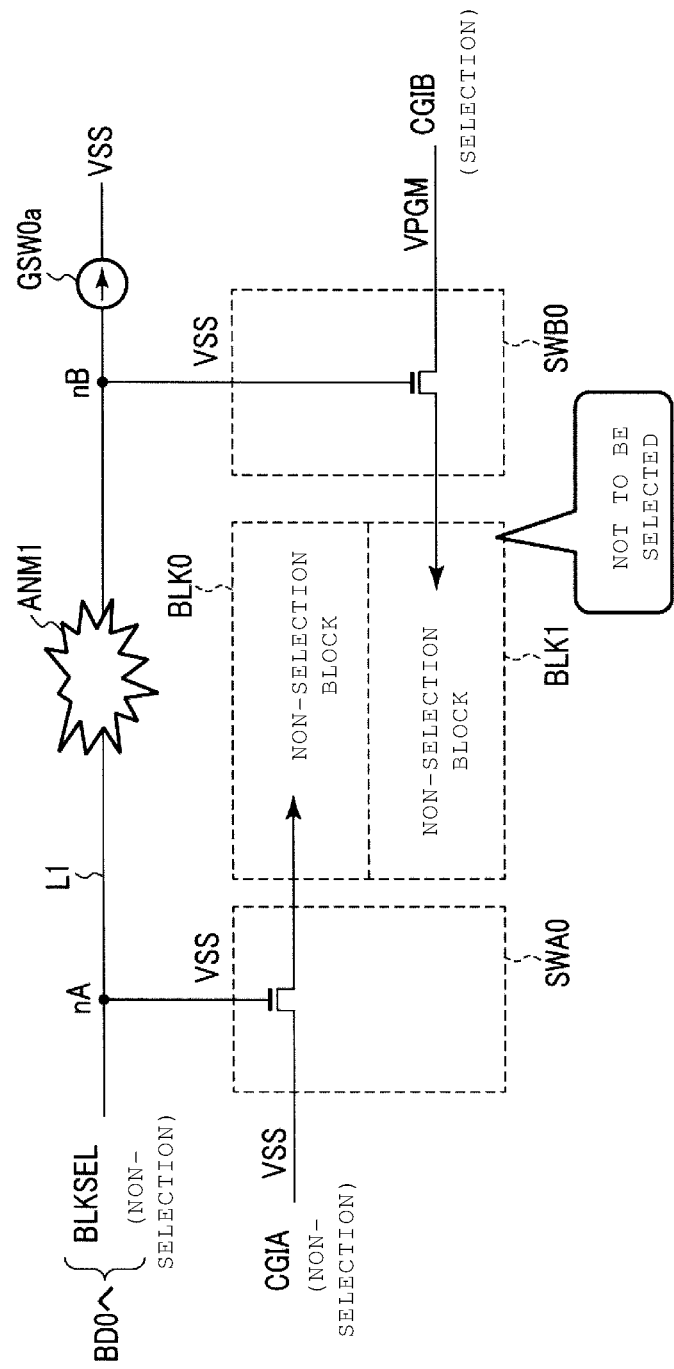
FIG. 13 is a schematic view illustrating an advantageous effect brought about by the semiconductor memory device according to the second embodiment.

FIG. 13 is a schematic view illustrating an advantageous effect of the semiconductor memory device according to the second embodiment. Referring to FIG. 13, as in FIG. 9, step-cuts ANM1 occur between the node nA, which is connected to the transfer switch group SWA0, and the node nB, which is connected to the transfer switch group SWB0, on the wiring L1. Moreover, in FIG. 13, the blocks BLK0 and BLK1 are blocks that are targeted for non-writing.

As illustrated in FIG. 13, the block decoder BD0 outputs the ground voltage VSS as the block selection signal BLKSEL. The block selection signal BLKSEL is transferred to the transfer switch group SWA0 via the node nA, and thus the transfer transistors included in the transfer switch group SWA0 enter an off-state. On the other hand, the block selection signal BLKSEL does not reach the node nB due to occurrence of step-cuts ANM1, and is, therefore, not transferred to the transfer switch group SWB0.

However, the semiconductor memory device according to the second embodiment, which is a semiconductor memory device having a configuration in which one block decoder is used to select two blocks, is provided with the ground switch GSW0a. The ground switch GSW0a has one end to which the ground voltage VSS is supplied and the other end to which the wiring L1 is connected. The transfer switch groups SWA0 and SWB0 are connected between the other end of the ground switch GSW0a and the block decoder BD0 on the wiring L1. The ground switch GSW0a includes, for example, a high-resistance element and a constant current switch, and is configured to be constantly in an on-state.

Therefore, in a case where the block selection signal BLKSEL is an output at "H" level, a weak current flows to the wiring L1 via the ground switch GSW0a toward the ground (not illustrated). However, the magnitude of the current is limited to a small value to such an extent as not to disturb normal operations of the transfer switch groups SWA0 and SWB0. On the other hand, in a case where step-cuts ANM1 occur on the wiring L1, since the ground voltage VSS is transferred to the node nB via the ground switch GSW0a, the floating state of the node nB disappears. Thereby, all of the transfer transistors included in the transfer switch groups SWA0 and SWB0 enter an off-state to set each of the blocks BLK0 and BLK1 as a non-selection block. Accordingly, even in a case where step-cuts ANM1 occur on the wiring L1, a plurality of blocks BLK can be prevented from being selected in a concurrent manner.

3. Modification Examples

Figure 14:
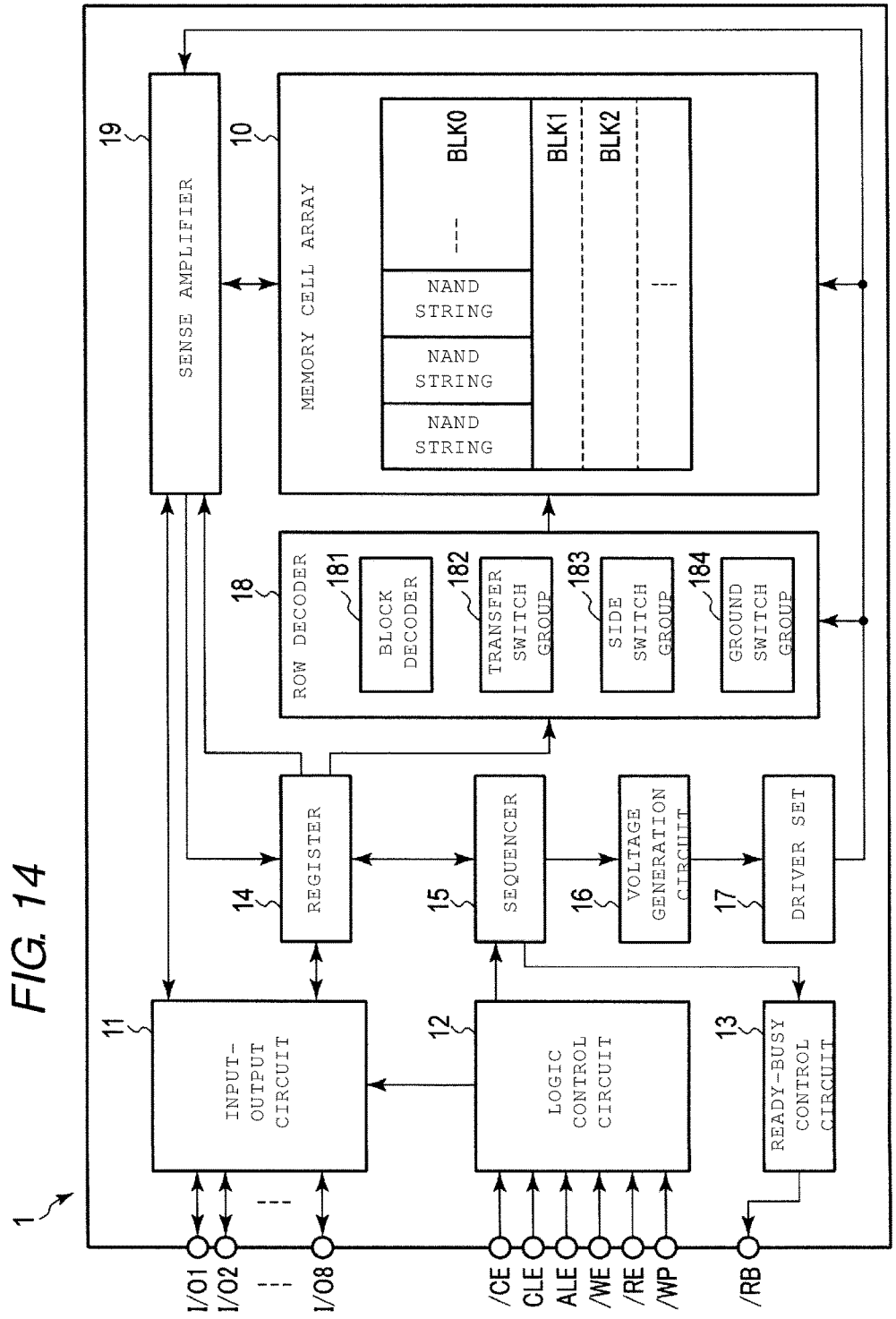
FIG. 14 is a block diagram illustrating a configuration of a semiconductor memory device according to a first modification example.
Figure 15:
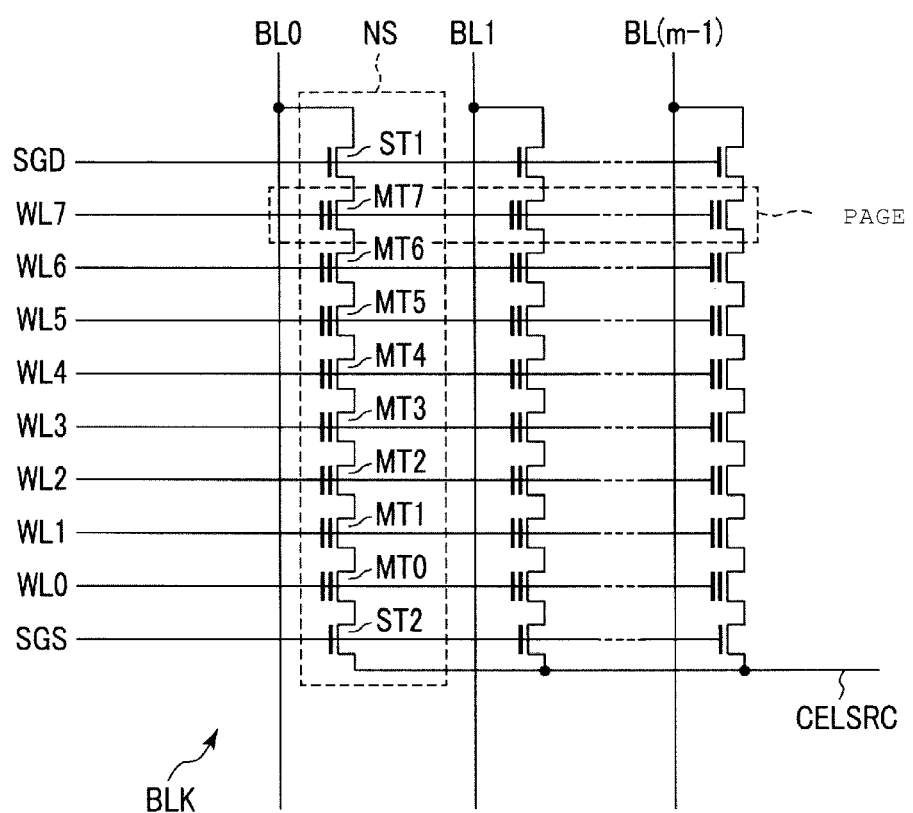
FIG. 15 is a circuit diagram illustrating a configuration of a memory cell array of the semiconductor memory device according to the first modification example.
Figure 16:
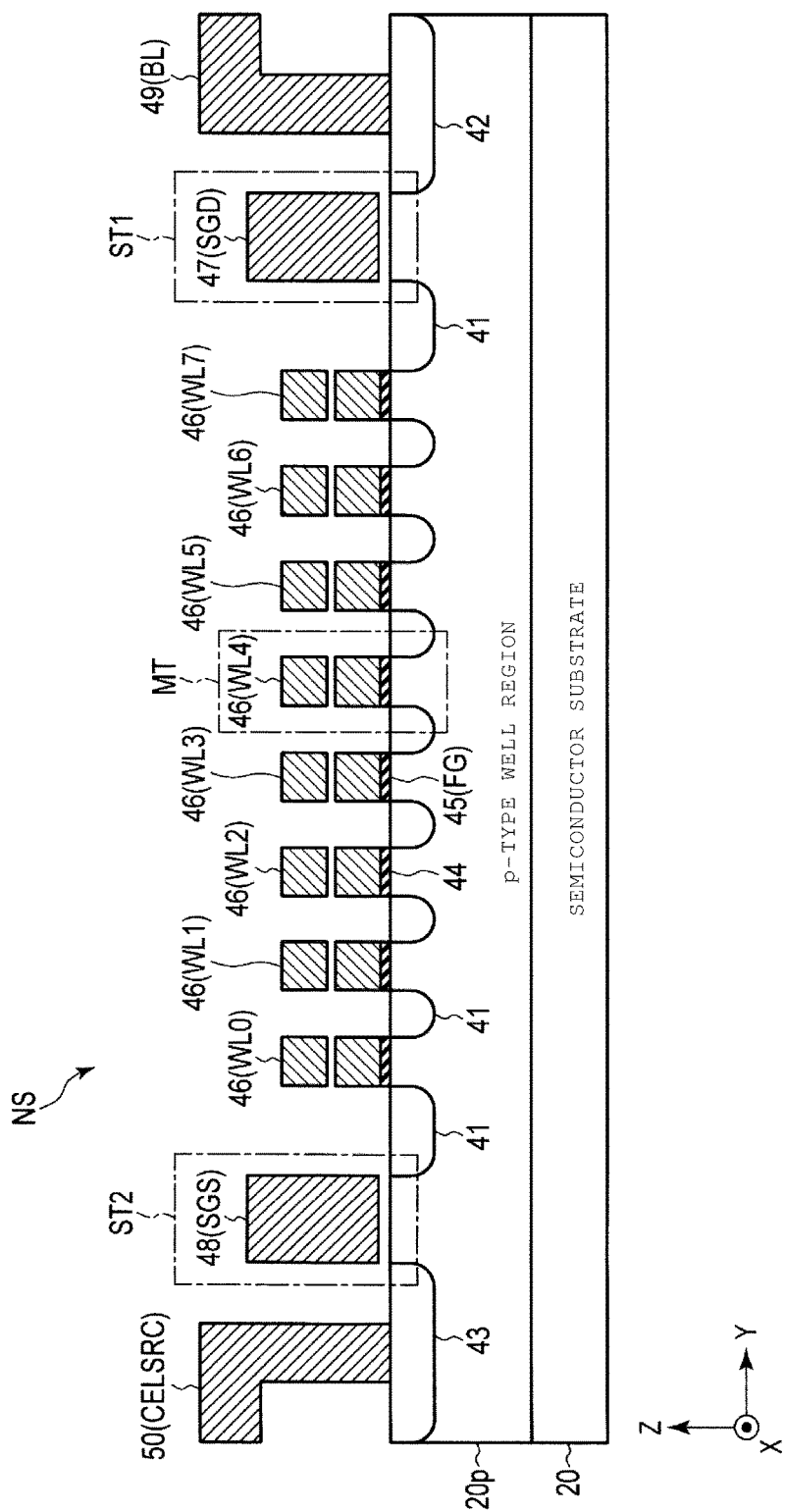
FIG. 16 is a cross-sectional view illustrating the configuration of the memory cell array of the semiconductor memory device according to the first modification example.

Embodiments are not limited to the above-described first embodiment and second embodiment and can be modified in various manners. For example, the semiconductor memory devices according to the first embodiment and the second embodiment, each of which is a three-dimensionally stacked NAND flash memory, can also be applied to a two-dimensionally stacked NAND flash memory as illustrated in FIGS. 14 and 15. FIG. 14 is a block diagram illustrating a configuration example of a semiconductor memory device according to a first modification example. FIG. 15 is a circuit diagram illustrating a configuration example of a memory cell array of the semiconductor memory device according to the first modification example. FIG. 16 illustrates an example of a cross-section structure of a portion of the memory cell array of the semiconductor memory device according to the first modification example. In particular, FIG. 16 illustrates, for example, a portion related to one NAND string NS included in one block BLK. Then, a plurality of configurations, each of which corresponds to the configuration about one block BLK illustrated in FIG. 16, is arrayed in the X-direction.

As illustrated in FIG. 14, each block BLK in the memory cell array 10 is an aggregation of a plurality of NAND strings NS, and includes no string unit SU.

FIG. 15 illustrates one block BLK, as an example, included in the memory cell array 10. As illustrated in FIG. 15, the block BLK includes a plurality of NAND strings NS. The bit lines BL are connected to the respective other ends of the selection transistors ST1 included in the NAND strings NS corresponding to the respective same columns in common in each block BLK. The word lines WL0 to WL7 are connected to the respective control gates of the memory cell transistors MT0 to MT7 included in each block BLK in common. For example, there are provided one select gate line SGD and one select gate line SGS. The select gate lines SGD and SGS are connected to the respective gates of the selection transistors ST1 and ST2, respectively, included in each block BLK in common. The source line CELSRC is connected to the respective other ends of the selection transistors ST2 included in each block BLK in common. Furthermore, data reading and writing are collectively performed at once with respect to the memory cell transistors MT connected to the same word line WL, as in the three-dimensionally stacked NAND flash memory. As mentioned above, this unit of data reading or writing is handled as a page.

As illustrated in FIG. 16, a plurality of $n^+$-type impurity diffusion regions 41 to 43 are provided at the upper portion of a p-type well region 20p along the Y-direction. A block insulating film 44 is provided on the upper surface of the p-type well region 20p located between the respective $n^+$-type impurity diffusion regions 41. For example, a charge storage layer 45, which functions as a floating gate (FG), is provided on the upper surface of the block insulating film 44. The charge storage layer 45 may be an insulating layer. Wiring layers 46 (WL0 to WL7), which function as word lines WL, are provided above the charge storage layer 45. Each of the wiring layers 46 extends, for example, in the X-direction. A wiring layer 47, which functions as a select gate line SGD, is provided above the p-type well region 20p located between the n+-type impurity diffusion regions 41 and 42. A wiring layer 48, which functions as a select gate line SGS, is provided above the p-type well region 20p located between the n+-type impurity diffusion regions 41 and 43. As mentioned above, the selection transistor ST1, a plurality of memory cell transistors MT, and the selection transistor ST2 are arranged along the Y-direction above the p-type well region 20p, thus configuring one NAND string NS. Moreover, wiring layers 49 and 50, which respectively function as a bit line BL and a source line CELSRC, are provided on the upper surfaces of the n+-type impurity diffusion regions 42 and 43, respectively.

With the above-described configuration, with regard to a two-dimensionally stacked NAND flash memory, the memory cell array 10 and the row decoder 18 can also be configured in a planar layout similar to that illustrated in FIG. 4. Accordingly, the semiconductor memory device according to the first modification example is able to obtain advantageous effects similar to those of the semiconductor memory device according to the first embodiment.

Besides, the following conditions can be applied to various embodiments.

In a multivalued-level reading operation (read), the voltage to be applied to a word line selected for a reading operation of level A is, for example, between 0 V and 0.55 V inclusive. That voltage is not limited to this range, but can be any one of between 0.1 V and 0.24 V inclusive, between 0.21 V and 0.31 V inclusive, between 0.31 V and 0.4 V inclusive, between 0.4 V and 0.5 V inclusive, and between 0.5 V and 0.55 V inclusive.

The voltage to be applied to a word line selected for a reading operation of level B is, for example, between 1.5 V and 2.3 V inclusive. That voltage is not limited to this range, but can be any one of between 1.75 V and 1.8 V inclusive, between 1.8 V and 1.95 V inclusive, between 1.95 V and 2.1 V inclusive, and between 2.1 V and 2.3 V inclusive.

The voltage to be applied to a word line selected for a reading operation of level C is, for example, between 3.0 V and 4.0 V inclusive. That voltage is not limited to this range, but can be any one of between 3.0 V and 3.2 V inclusive, between 3.2 V and 3.4 V inclusive, between 3.4 V and 3.5 V inclusive, between 3.5 V and 3.7 V inclusive, and between 3.7 V and 4.0 V inclusive.

The time of the reading operation (tR) can be set as, for example, any one of between 25 μs and 38 μs inclusive, between 38 μs and 70 μs inclusive, and between 70 μs and 80 μs inclusive.

The writing operation includes a program operation and a verification operation. In the writing operation, the voltage to be first applied to a word line selected for the program operation is, for example, between 13.7 V and 14.3 V inclusive. That voltage is not limited to this range, but can be, for example, any one of between 13.7 V and 14.0 V inclusive and between 14.0 V and 14.7 V inclusive.

The voltage to be first applied to a word line selected at the time of writing on the odd-numbered word line and the voltage to be first applied to a word line selected at the time of writing on the even-numbered word line can be set different from each other.

When the program operation is performed by an incremental step pulse program (ISPP) method, examples of the voltage for step-up include about 0.5 V.

The voltage to be applied to a non-selection word line can be, for example, between 7.0 V and 7.3 V inclusive. That voltage is not limited to this range, but can be, for example, between 7.3 V and 8.4 V inclusive or can be 7.0 V or lower.

The pass voltage to be applied can be changed depending on whether the non-selection word line is an odd-numbered word line or an even-numbered word line.

The time of the writing operation (tProg) can be set as, for example, anyone of between 1,700 μs and 1, 800 μs inclusive, between 1,800 μs and 1,900 μs inclusive, and between 1,900 μs and 2,000 μs inclusive.

In an erasure operation, the voltage to be first applied to a well which is formed at the upper portion of a semiconductor substrate and above which the memory cell is arranged is, for example, between 12 V and 13.7 V inclusive. That voltage is not limited to this range, but can be, for example, any one of between 13.7 V and 14.8 V inclusive, between 14.8 V and 19.0 V inclusive, between 19.0 V and 19.8 V inclusive, and between 19.8 V and 21 V inclusive.

The time of the erasure operation (tErase) can be set as, for example, any one of between 3,000 μs and 4,000 μs inclusive, between 4,000 μs and 5,000 μs inclusive, and between 4,000 μs and 9,000 μs inclusive.

The memory cell includes a charge storage layer arranged on a semiconductor substrate (silicon substrate) via a tunnel insulating layer with a film thickness of 4 to 10 nm. The charge storage layer can be SiN with a film thickness of 2 to 3 nm or a stacked structure configured with an insulating film of, for example, SiON and polysilicon with a film thickness of 3 to 8 nm. Moreover, a metal such as Ru can be added to polysilicon. An insulating film is formed on the charge storage layer. The insulating film includes, for example, a silicon dioxide film with a film thickness of 4 to 10 nm interposed between a lower-layer high-k film with a film thickness of 3 to 10 nm and an upper-layer high-k film with a film thickness of 3 to 10 nm. Examples of the high-k film include HfO. Moreover, the film thickness of the silicon dioxide film can be set larger than the film thickness of the high-k film. A control electrode with a film thickness of 30 nm to 70 nm is formed on the insulating film via a material for work function adjustment with a film thickness of 3 nm to 10 nm. Here, the material for adjusting a work function is a metal oxide film, such as TaO, or a metal nitride film, such as TaN. The control electrode can be made from, for example, W.

Furthermore, an air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
   a memory cell array arranged in a plurality of memory blocks comprising at least a first memory block and a second memory block;

a switch comprising a first terminal connected to receive a first voltage, a second terminal connected to a first wiring, and a gate connected to a second wiring;

a first transistor comprising a gate electrically connected to the first wiring at a first position;

a second transistor comprising a gate electrically connected to the first wiring at a second position; and a block decoder configured to output a first signal to the first wiring and to output a second signal to the second wiring, the block decoder configured to select both the first memory block and the second memory block according to a logic level of the second signal.

2. The semiconductor memory device according to claim 1, wherein a logic level of the first signal is substantially the same as the first voltage.

3. The semiconductor memory device according to claim 1, wherein the gate of the first transistor and the gate of the second transistor are configured to receive the first signal and the first voltage concurrently, respectively, when the first wiring has an electrical disconnection or is in a high resistance state between the first position and the second position.

4. The semiconductor memory device according to claim 1, wherein the gate of the first transistor and the gate of the second transistor are configured to receive the first signal and the first voltage concurrently, respectively, when the switch is turned on according to the second signal.

5. The semiconductor memory device according to claim 1, wherein
the first transistor is disposed relative to a first side of the memory cell array, and
the second transistor is disposed relative to a second side of the memory cell array, the second side opposite the first side in a first direction.

6. The semiconductor device according to claim 1, wherein the first wiring is arranged to extend in a first direction from the first position relative to a first side of the memory cell array to the second position relative to a second side of the memory cell array, the second side opposite the first side in the first direction.

7. The semiconductor device according to claim 5, wherein the second wiring is arranged to extend from a position relative to the first side of the memory cell array to a second position relative to the second side of the memory cell array.

8. The semiconductor memory device according to claim 1, wherein the first position is relative to a first side of the memory cell array, and the second position is relative to a second side of the memory cell array, the second side opposite of the first side.

9. The semiconductor memory device according to claim 5, wherein the block decoder is disposed relative to the first side of the memory cell array, and
the switch is disposed relative to the second side of the memory cell array.

10. The semiconductor memory device according to claim 9, wherein the first wiring or the second wiring are arranged to extend between the block decoder and the switch.

11. The semiconductor memory device according to claim 1, wherein the first voltage and the second voltage have an inverse relationship.

12. The semiconductor memory device according to claim 1, wherein the switch is configured to turn on when the first signal is at a first logic level and turn off when the first signal is at a second logic level.

13. The semiconductor memory device according to claim 1, further comprising:
a third transistor comprising a gate arranged to receive a third signal;
a fourth transistor comprising a gate arranged to receive a fourth signal, the fourth signal being different from the third signal; and
a driver electrically connected to the first transistor via the third transistor and electrically connected to the second transistor via the fourth transistor.

14. The semiconductor memory device according to claim 1, wherein the block decoder comprises:
an AND circuit configured to output a fifth signal according to a result of memory address;
a level shifter configured to generate the first signal based on the fourth signal; and
an inverter configured to generate the second signal by inverting the fifth signal.

15. The semiconductor memory device according to claim 14, wherein the semiconductor memory device includes a first set and a second set,
each of the first set and the second set includes the block decoder, the first transistor, and the second transistor, and
the driver is electrically connected to first terminals of the first transistors of the first set and the second set via the third transistor, and is electrically connected to first terminals of the second transistors of the first set and the second set via the fourth transistor.

* * * * *